United States Patent
Jimbo et al.

(10) Patent No.: US 12,425,280 B2
(45) Date of Patent: Sep. 23, 2025

(54) TRANSMISSION DEVICE AND RECEPTION DEVICE

(71) Applicant: Kioxia Corporation, Tokyo (JP)

(72) Inventors: Ushio Jimbo, Kamakura Kanagawa (JP); Manabu Watanabe, Kawasaki Kanagawa (JP); Daisuke Sonoda, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 214 days.

(21) Appl. No.: 18/459,917

(22) Filed: Sep. 1, 2023

(65) Prior Publication Data

US 2024/0097950 A1  Mar. 21, 2024

(30) Foreign Application Priority Data

Sep. 20, 2022  (JP) ................................ 2022-149353

(51) Int. Cl.
*H04L 25/49* (2006.01)
*H03M 5/14* (2006.01)

(52) U.S. Cl.
CPC ........ *H04L 25/4908* (2013.01); *H03M 5/145* (2013.01); *H04L 25/4902* (2013.01)

(58) Field of Classification Search
CPC ..... H03M 5/14; H03M 5/145; H04L 25/4908; H04L 25/4902; H04L 25/4917
See application file for complete search history.

(56) References Cited

U.S. PATENT DOCUMENTS

| 6,934,902 B2 * | 8/2005 | Hara ................... H03M 13/091 714/757 |
| 7,081,838 B2 | 7/2006 | Høyer |
| 7,779,327 B2 * | 8/2010 | Lee ......................... H04L 1/007 714/755 |
| 8,711,017 B2 * | 4/2014 | Shibata ............... H04L 25/4908 341/100 |
| 8,782,484 B2 * | 7/2014 | Terashima ............ H04L 1/0041 714/755 |
| 9,065,461 B1 * | 6/2015 | Wong ...................... H03M 1/12 |

(Continued)

FOREIGN PATENT DOCUMENTS

| JP | 2008-526170 A | 7/2008 |
| JP | WO2018/110480 A1 | 10/2019 |
| JP | 2021-044046 A | 3/2021 |

*Primary Examiner* — Lam T Mai
(74) *Attorney, Agent, or Firm* — Kim & Stewart LLP

(57) ABSTRACT

A transmission device includes an encoding circuit and a modulation circuit. The encoding circuit is configured to encode first and second data stream portions of a transmission data stream in accordance with first and second encoding protocols, respectively, convert each M bit of the encoded second data stream portion into a high-resolution value of N bit, and generate a baseband data stream including the encoded first data stream portion and the converted second data stream portion. The modulation circuit is configured to perform a $2^N$-level pulse amplitude modulation with respect to each N bit of the encoded first data stream portion in the baseband data stream and each N bit of the converted second data stream portion in the baseband data stream, to generate a transmission signal. M is an integer equal to or greater than 1 and N is an integer greater than M.

20 Claims, 20 Drawing Sheets

(56) References Cited

U.S. PATENT DOCUMENTS

| | | | |
|---|---|---|---|
| 10,623,745 B2* | 4/2020 | Damnjanovic | H04N 19/33 |
| 11,100,031 B2 | 8/2021 | Ban et al. | |
| 11,818,181 B1* | 11/2023 | Marcus | G06F 3/04845 |
| 2005/0018785 A1* | 1/2005 | Oshima | H04N 21/234327 |
| | | | 348/E11.003 |
| 2010/0061467 A1* | 3/2010 | Ogiso | H04B 1/3827 |
| | | | 375/257 |
| 2011/0038428 A1* | 2/2011 | Fukuda | H04B 3/548 |
| | | | 375/259 |
| 2011/0102208 A1* | 5/2011 | Terashima | H04L 25/4919 |
| | | | 341/67 |
| 2012/0134394 A1* | 5/2012 | Allen | H04L 25/4917 |
| | | | 375/300 |
| 2020/0084072 A1 | 3/2020 | Masuda et al. | |
| 2023/0073629 A1* | 3/2023 | Han | H04L 25/4917 |
| 2023/0156463 A1* | 5/2023 | Jeon | H04W 12/033 |
| | | | 726/26 |
| 2023/0188218 A1* | 6/2023 | Kasai | H04B 10/516 |
| | | | 398/38 |

* cited by examiner

FIG. 17

| Sync (4BIT) | CONTROL CODE (20 BIT) | CONTROL CODE (20 BIT) | CONTROL CODE (20 BIT) | CONTROL CODE (20 BIT) | FILLER (20 BIT) | FILLER (20 BIT) | 8 BIT | 2-LEVEL MODE |
| Sync (4BIT) | PAYLOAD DATA (128 BIT) | | | | | | | 4-LEVEL MODE |
| Sync (4BIT) | PAYLOAD DATA (128 BIT) | | | | | | | 4-LEVEL MODE | |CUMULATIVE VALUE| > FIRST THRESHOLD
| Sync (4BIT) | PAYLOAD (20 BIT) | PAYLOAD (20 BIT) | PAYLOAD (20 BIT) | PAYLOAD (20 BIT) | PAYLOAD (20 BIT) | PAYLOAD (20 BIT) | 8 BIT | 2-LEVEL MODE |
| Sync (4BIT) | PAYLOAD (20 BIT) | PAYLOAD (20 BIT) | PAYLOAD (20 BIT) | PAYLOAD (20 BIT) | PAYLOAD (20 BIT) | PAYLOAD (20 BIT) | 8 BIT | 2-LEVEL MODE | |CUMULATIVE VALUE| < SECOND THRESHOLD
| Sync (4BIT) | PAYLOAD DATA (128 BIT) | | | | | | | 4-LEVEL MODE |
| Sync (4BIT) | PAYLOAD DATA (128 BIT) | | | | | | | 4-LEVEL MODE | |CUMULATIVE VALUE| > FIRST THRESHOLD
| Sync (4BIT) | PAYLOAD (20 BIT) | PAYLOAD (20 BIT) | PAYLOAD (20 BIT) | PAYLOAD (20 BIT) | PAYLOAD (20 BIT) | PAYLOAD (20 BIT) | 8 BIT | 2-LEVEL MODE |
| Sync (4BIT) | PAYLOAD (20 BIT) | PAYLOAD (20 BIT) | PAYLOAD (20 BIT) | PAYLOAD (20 BIT) | PAYLOAD (20 BIT) | PAYLOAD (20 BIT) | 8 BIT | 2-LEVEL MODE | |CUMULATIVE VALUE| < SECOND THRESHOLD
| Sync (4BIT) | PAYLOAD DATA (128 BIT) | | | | | | | 4-LEVEL MODE |
| Sync (4BIT) | PAYLOAD DATA (128 BIT) | | | | | | | 4-LEVEL MODE |
| Sync (4BIT) | CONTROL CODE (20 BIT) | CONTROL CODE (20 BIT) | CONTROL CODE (20 BIT) | CONTROL CODE (20 BIT) | CONTROL CODE (20 BIT) | CONTROL CODE (20 BIT) | 8 BIT | 2-LEVEL MODE |

TRANSMISSION DEVICE AND RECEPTION DEVICE

CROSS-REFERENCE TO RELATED APPLICATION(S)

This application is based upon and claims the benefit of priority from Japanese Patent Application No. 2022-149353, filed Sep. 20, 2022, the entire contents of which are incorporated herein by reference.

FIELD

Embodiments described herein relate generally to a transmission device and a reception device.

BACKGROUND

In the related art, in data transmission, as an encoding method (e.g., protocol) of a data stream to be transmitted to a transmission line, non-return-to-zero (NRZ) and 8b/10b encoding is adopted in many cases. Recently, adopting pulse amplitude modulation 4 (PAM4) as a data transmission standard for implementing high-speed transmission is being considered. The 8b/10b encoding method can achieve, for example, low consecutive identical digits (CID), DC balance, and error detection by running disparity. The 8b/10b encoding method is based on NRZ and is difficult to be used with a data transmission standard in which PAM4 is adopted.

However, in most of past data transmission standards, the 8b/10b encoding method is adopted. Therefore, the data transmission standard in which PAM4 is adopted may have low affinity to data transmission standards in the related art.

BRIEF DESCRIPTION OF THE DRAWINGS

FIG. 17 is a diagram illustrating a data packet according to a fourth embodiment.

DETAILED DESCRIPTION

Embodiments provide a transmission device and a reception device that can process a transmission signal to which a line encoding method that is used for a 2-level signal and multi-level pulse amplitude modulation are suitably applied.

In general, according to one an embodiment, a transmission device includes an encoding circuit and a modulation circuit. The encoding circuit is configured to encode a first data stream portion of a transmission data stream in accordance with a first encoding protocol and a second data stream portion of the transmission data stream in accordance with a second encoding protocol, convert each M bit of the encoded second data stream portion into a high-resolution value of N bit, M being an integer equal to or greater than 1 and N being an integer greater than M, and generate a baseband data stream including the encoded first data stream portion and the converted second data stream portion. The modulation circuit is configured to perform a $2^N$-level pulse amplitude modulation with respect to each N bit of the encoded first data stream portion in the baseband data stream and each N bit of the converted second data stream portion in the baseband data stream, to generate a transmission signal.

Hereinafter, embodiments will be described in detail with reference to the accompanying drawings. The present disclosure is not limited to the embodiments.

First Embodiment

First, an information processing system 10 according to a first embodiment will be described.

Figure 1:
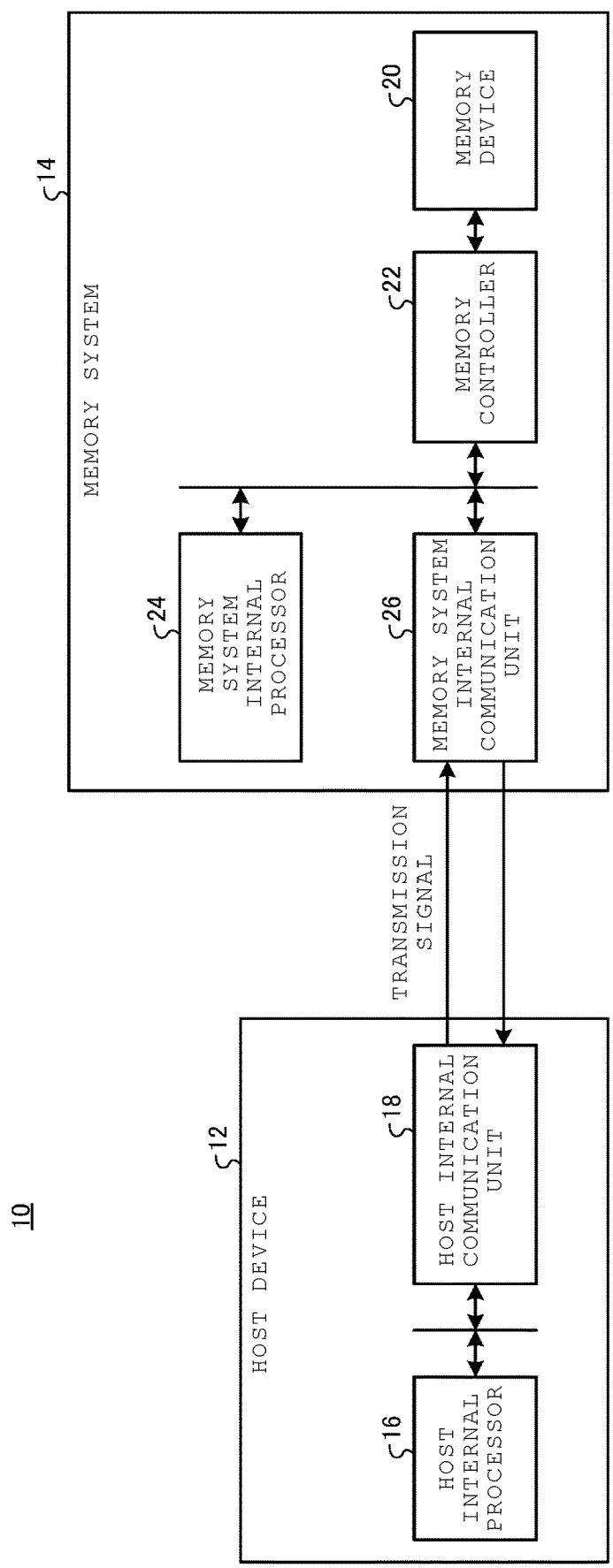
FIG. 1 is a diagram illustrating a configuration of an information processing system according to a first embodiment.

FIG. 1 is a diagram illustrating a configuration of the information processing system 10 according to the first embodiment. The information processing system 10 includes a host device 12 and a memory system 14.

The host device 12 includes a host internal processor 16 and a host internal communication unit 18. The host internal processor 16 executes a program to execute information processing according to the program. The host internal communication unit 18 transmits and receives a transmission signal to and from the memory system 14 according to the control of the host internal processor 16.

The memory system 14 functions as a storage device of the host device 12. The memory system 14 includes a memory device 20, a memory controller 22, a memory system internal processor 24, and a memory system internal communication unit 26. The memory controller 22, the memory system internal processor 24, and the memory system internal communication unit 26 may be packaged as one semiconductor device.

The memory device 20 is, for example, one or a plurality of nonvolatile semiconductor memory chips. The nonvolatile semiconductor memory is, for example, a NAND flash memory. The memory device 20 may include one or a plurality of volatile semiconductor memory chips such as DRAM and nonvolatile semiconductor memory chips, or may include one or a plurality of volatile semiconductor memory chips.

The memory controller 22 accesses the memory device 20, for example, to write and read data in response to a request or the like from the host device 12. The memory system internal processor 24 executes a program to execute information processing according to the program. The memory system internal communication unit 26 transmits and receives the transmission signal to and from the host device 12 according to the control of the memory system internal processor 24.

Figure 2:
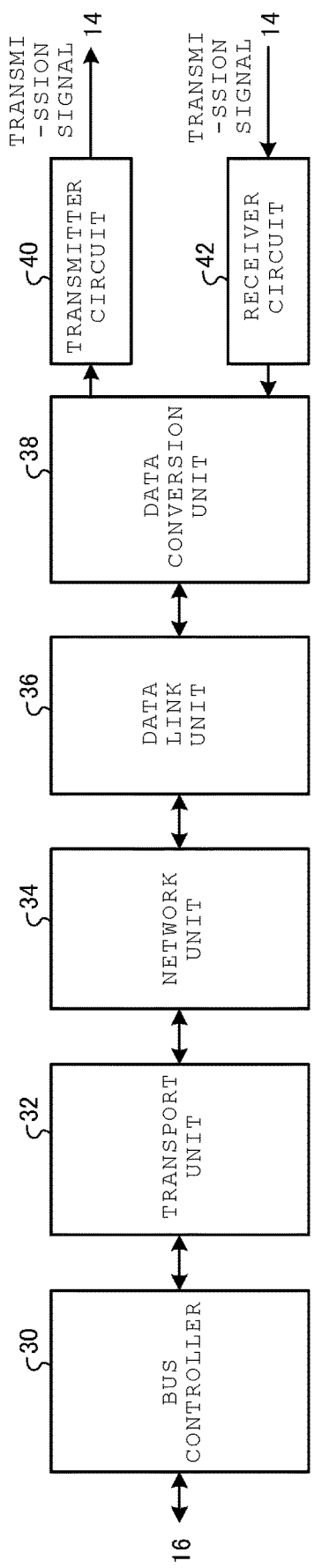
FIG. 2 is a diagram illustrating a configuration of a host internal communication unit.

FIG. 2 is a diagram illustrating a configuration of the host internal communication unit 18. The host internal communication unit 18 includes a bus controller 30, a transport unit 32, a network unit 34, a data link unit 36, a data conversion unit 38, a transmitter circuit 40, and a receiver circuit 42. The transport unit 32, the network unit 34, the data link unit 36, and the data conversion unit 38 are implemented by, for example, a circuit such as a link controller.

The bus controller 30 controls data exchange with the host internal processor 16 via a bus. The transport unit 32 executes an error correction process, a retransmission process, and the like. The network unit 34 executes processes related to a network, for example, path selection and relay. The data link unit 36 executes processes related to data exchange with a device of a direct communication target. The data conversion unit 38 executes an encoding process and a decoding process using a predetermined line encoding method. The transmitter circuit 40 transmits the transmission signal to the memory system 14. The receiver circuit 42 receives the transmission signal from the memory system 14.

During transmission, the bus controller 30 acquires substantial data from the host internal processor 16 via the bus. During transmission, the substantial data acquired by the bus controller 30 is transmitted to the transmitter circuit 40 via the transport unit 32, the network unit 34, the data link unit 36, and the data conversion unit 38. The transmitter circuit 40 modulates the data acquired from the data conversion unit 38 to generate a transmission signal and transmits the generated transmission signal to the memory system 14.

During reception, the receiver circuit 42 receives the transmission signal from the memory system 14 and executes clock recovery and sampling on the received transmission signal. The data acquired by the sampling of the receiver circuit 42 is transmitted to the bus controller 30 via the data conversion unit 38, the data link unit 36, the network unit 34, and the transport unit 32. During reception, the bus controller 30 transmits the substantial data acquired from the transport unit 32 to the host internal processor 16 via the bus.

The memory system internal communication unit 26 also has the same configuration as the host internal communication unit 18. It should be noted that the transmitter circuit 40 of the memory system internal communication unit 26 transmits the transmission signal to the host device 12. The receiver circuit 42 of the memory system internal communication unit 26 receives the transmission signal from the host device 12. The bus controller 30 of the memory system internal communication unit 26 transmits and receives data to and from the memory controller 22 or the memory system internal processor 24 via the bus.

Figure 3:
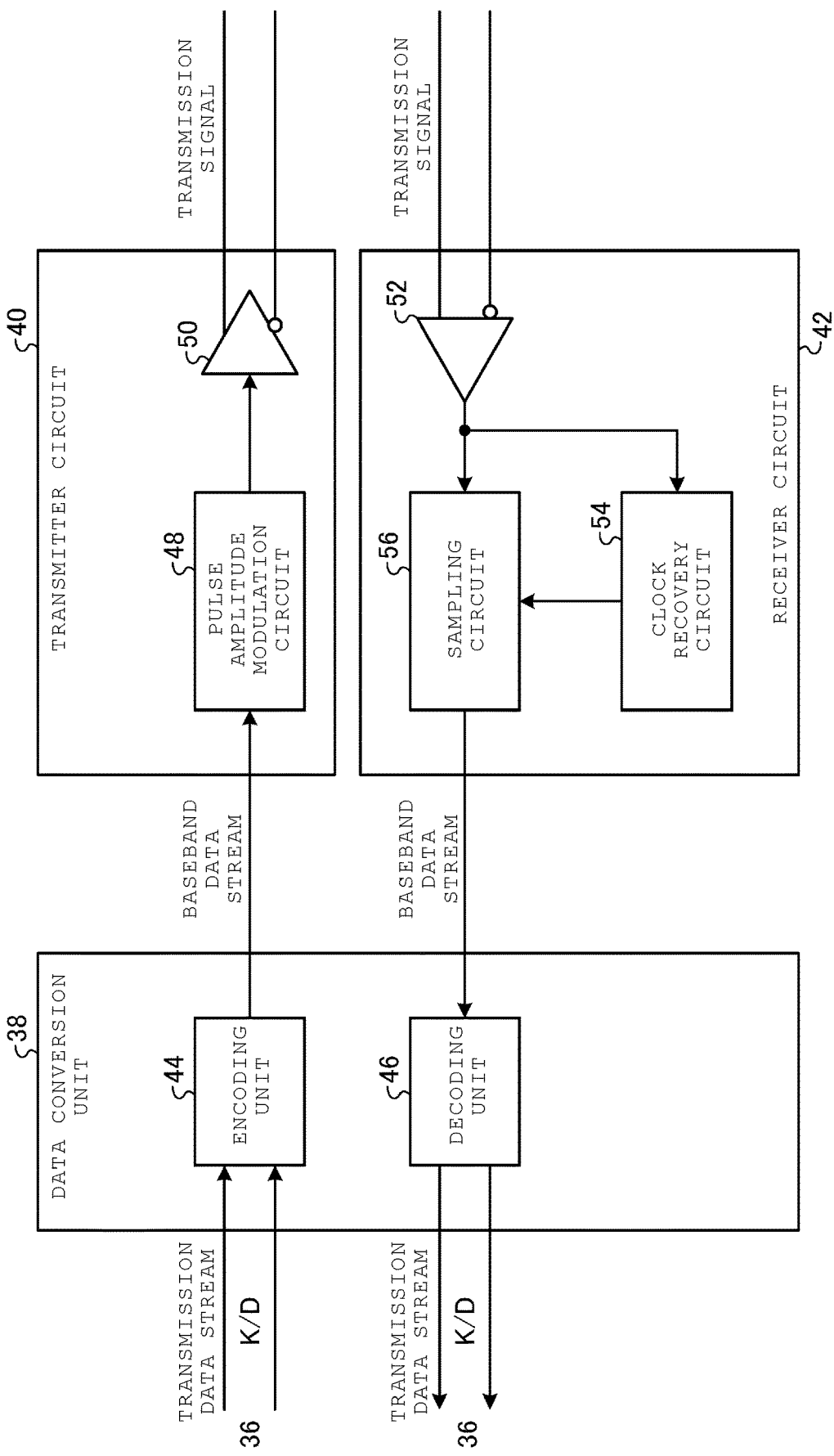
FIG. 3 is a diagram illustrating a configuration of a data conversion unit, a transmitter circuit, and a receiver circuit.

FIG. 3 is a diagram illustrating a configuration of the data conversion unit 38, the transmitter circuit 40, and the receiver circuit 42.

The data conversion unit 38 includes an encoding unit 44 and a decoding unit 46. The transmitter circuit 40 includes a pulse amplitude modulation circuit 48 and a transmission amplifier 50. The receiver circuit 42 includes a reception amplifier 52, a clock recovery circuit 54, and a sampling circuit 56.

During transmission, the encoding unit 44 receives a transmission data stream that is a series of data bits from the data link unit 36. In the present embodiment, the encoding unit 44 further receives a K/D signal representing a position of a control code in the transmission data stream from the data link unit 36.

The encoding unit 44 encodes the transmission data stream using a predetermined first line encoding method and converts the encoded transmission data stream into a baseband data stream that is a series of data bits. The first line encoding method is, for example, an encoding method that is suitable for multi-level amplitude modulation. For example, the first line encoding method is a 128b/132b encoding method. The first line encoding method may be another encoding method such as a 64b/68b encoding method. The encoding unit 44 provides the baseband data stream to the transmitter circuit 40.

During transmission, the pulse amplitude modulation circuit 48 receives the baseband data stream from the encoding unit 44. The pulse amplitude modulation circuit 48 generates a transmission signal by performing 4-level pulse amplitude modulation with respect to the baseband data stream for each set including two bits. A period in which each set (that is, four levels) including two bits in the baseband data stream is modulated in the transmission signal will be referred to as unit period.

During transmission, the transmission amplifier 50 amplifies the transmission signal generated by the pulse amplitude modulation circuit 48 and transmits the amplified signal to a device of a communication target via a transmission line. In the present embodiment, the transmission amplifier 50 transmits a differential transmission signal to the communication target via the transmission line.

During reception, the reception amplifier 52 receives the transmission signal on which 4-level pulse amplitude modulation has been performed per unit period from the communication target via the transmission line, amplifies the received signal, and outputs the amplified signal. In the present embodiment, the reception amplifier 52 receives the differential transmission signal and outputs a single-ended transmission signal. The clock recovery circuit 54 generates a clock signal synchronized with the unit period from the transmission signal. The sampling circuit 56 samples the transmission signal per unit period based on the clock signal, and acquires a set including two bits per unit period. The sampling circuit 56 generates the baseband data stream that is a series of data bits acquired by the sampling. The sampling circuit 56 provides the generated baseband data stream to the decoding unit 46.

During reception, the decoding unit 46 receives the baseband data stream from the receiver circuit 42. The decoding unit 46 decodes the baseband data stream using the predetermined first line encoding method and generates a transmission data stream that is a series of data bits. The decoding unit 46 provides the generated transmission data stream to the data link unit 36. In the present embodiment, the decoding unit 46 detects a control code in the baseband data stream and provides a K/D signal representing a position of the control code in the transmission data stream to the data link unit 36.

Figure 4:
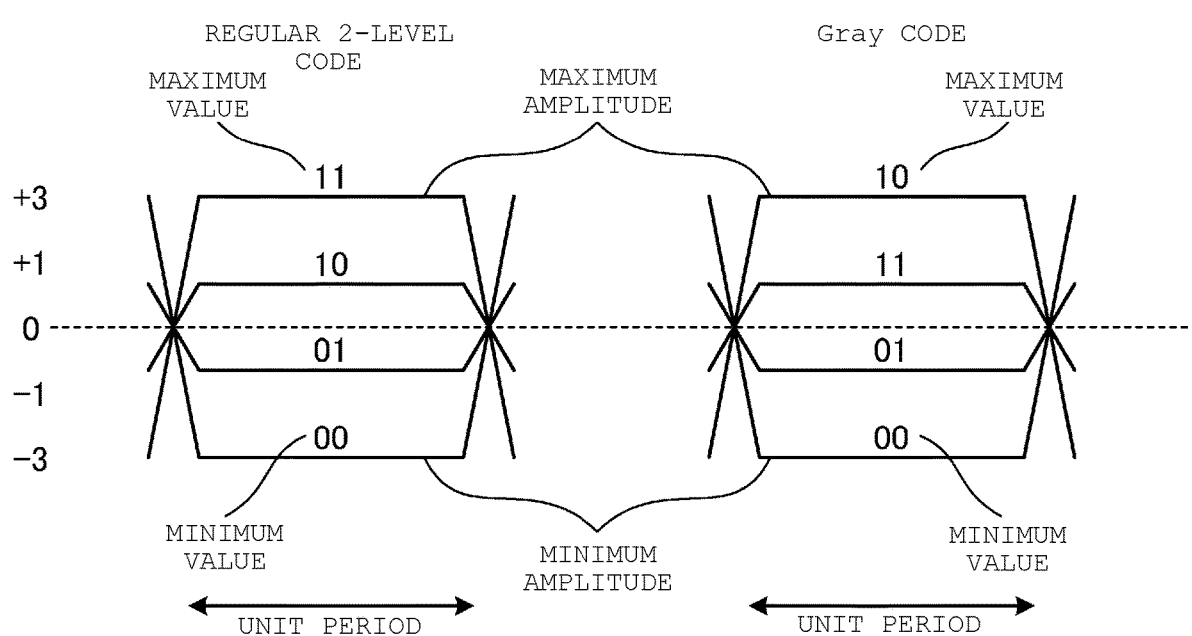
FIG. 4 is a diagram illustrating a waveform of a transmission signal on which 4-level pulse amplitude modulation has been performed.

FIG. 4 is a diagram illustrating a waveform of the transmission signal on which 4-level pulse amplitude modulation has been performed. In the transmission signal on which 4-level pulse amplitude modulation has been performed, four different amplitudes can be acquired per unit period.

For example, the intermediate value of the amplitude of the transmission signal is assumed as 0. In the transmission signal, when the modulated value is 00, the amplitude is, for example, −3. In the transmission signal, when the modulated value is 01, the amplitude is −1. In the transmission signal, when the modulated value is 10, the amplitude is +1. In the transmission signal, when the modulated value is 11, the amplitude is +3.

In the transmission signal, the modulated value may be a Gray code. In the transmission signal, when the modulated value is a Gray code of 11, the amplitude is +1. In the transmission signal, when the modulated value is a Gray code of 10, the amplitude is +3. The values of the amplitudes of the transmission signal are examples and may be other levels. The positive or negative of amplitudes of the transmission signal may be reversed with respect to the modulated values.

Here, among the four amplitude levels that can be acquired from the transmission signal, a value modulated as a maximum amplitude level will be referred to as a maximum value. In the example of FIG. 4, the maximum value of the regular 2-level code is 11, and the maximum value of the Gray code is 10.

Among the four amplitude levels that can be acquired from the transmission signal, a value modulated as a minimum amplitude level will be referred to as a minimum value. In the example of FIG. 4, the minimum value of the regular 2-level code is 00, and the minimum value of the Gray code is also 00.

Figure 5:
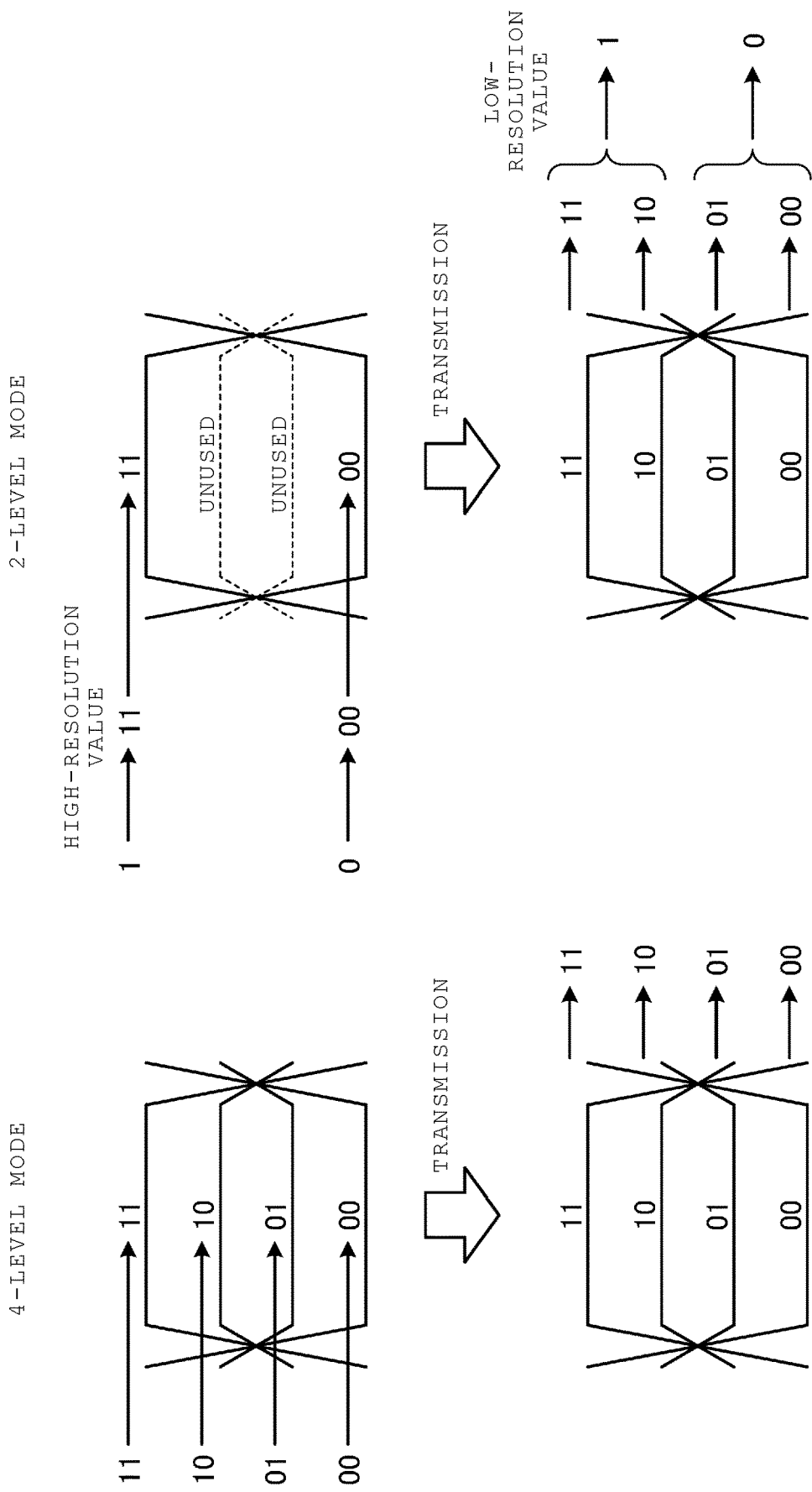
FIG. 5 is a diagram illustrating a modulation method and a decoding method of a transmission signal according to an embodiment.

FIG. 5 is a diagram illustrating a modulation method and a decoding method of the transmission signal according to the present embodiment.

During transmission, the encoding unit 44 receives the transmission data stream from the data link unit 36. The encoding unit 44 encodes a first data stream in the transmission data stream in a 4-level mode. Specifically, the encoding unit 44 encodes the first data stream using the first line encoding method and adds the encoded first data stream to the baseband data stream.

The encoding unit 44 encodes a second data stream different from the first data stream in the transmission data stream in a 2-level mode. Specifically, the encoding unit 44 encodes the second data stream using a second line encoding method different from the first line encoding method. The second line encoding method is, for example, an 8b/10b encoding method.

Next, the encoding unit 44 converts each value in the second data stream encoded using the second line encoding method into a high-resolution value. The high-resolution value is a value representing any one of the maximum value that is modulated as the maximum amplitude or the minimum value that is modulated as the minimum amplitude in the 4-level pulse amplitude modulation. For example, the encoding unit 44 converts 1 in the second data stream into 11. For example, the encoding unit 44 converts 0 in the second data stream into 00. When the Gray code is used, the encoding unit 44 converts 1 in the second data stream into 10. In the 2-level mode, the encoding unit 44 does not use amplitudes other than the maximum amplitude or the minimum amplitude. The encoding unit 44 adds the second data stream converted into a series of the high-resolution values to the baseband data stream.

During reception, the decoding unit 46 receives the baseband data stream from the receiver circuit 42. The decoding unit 46 decodes the first data stream in the baseband data stream in the 4-level mode. Specifically, the decoding unit 46 decodes the first data stream using the first line encoding method, adds the decoded first data stream to the transmission data stream, and outputs the transmission data stream.

The decoding unit 46 decodes the second data stream different from the first data stream in the baseband data stream in the 2-level mode. Specifically, first, the decoding unit 46 converts the second data stream into a low-resolution value for each set including two bits. For example, the decoding unit 46 converts a set including two bits that is sampled in the unit period and has an amplitude larger than the intermediate value, for example, 11 or 10 into 1. The decoding unit 46 converts a set including two bits that is sampled in the unit period and has an amplitude smaller than the intermediate value, for example, 00 or 01 into 0. The decoding unit 46 decodes the second data stream converted into a series of the low-resolution values using the second line encoding method, adds the decoded second data stream to the transmission data stream, and outputs the transmission data stream.

For example, the second data stream is a control code for controlling transmission and reception. For example, by referring to the K/D signal, the encoding unit 44 can detect the position of the control code in the transmission data stream provided from the data link unit 36. For example, the decoding unit 46 can detect the position of the control code in the baseband data stream from a position of a synchronization code in the baseband data stream.

As described above, the information processing system 10 according to the first embodiment can include the second data stream that is a series of data bits as a part of the transmission signal on which 4-level pulse amplitude modulation is performed. The second data stream is a series of data bits, and thus can be encoded using an encoding method that is used in the related art, for example, using the 8b/10b encoding method. As a result, the information processing system 10 according to the first embodiment can transmit and receive the transmission signal on which 4-level pulse amplitude modulation having high affinity to the line encoding method used for a 2-level signal has been performed. For example, the information processing system 10 according to the first embodiment can transmit and receive the transmission signal where the control code that is used in the line encoding method used for a 2-level signal is modulated into a part of the transmission signal on which 4-level pulse amplitude modulation is performed.

The transmitter circuit 40 and the receiver circuit 42 can transmit and receive not only the transmission signals on which the 4-level pulse amplitude modulation is performed and also a transmission signal on which $2^N$-level (N represents an integer of 2 or more) pulse amplitude modulation is performed per unit period.

Here, during transmission, the transmitter circuit 40 generates a transmission signal by performing $2^N$-level pulse amplitude modulation on the baseband data stream for each set including N bits. The encoding unit 44 encodes the first data stream in the transmission data stream in the $2^N$-level mode. Specifically, the encoding unit 44 encodes the first data stream using the first line encoding method and adds the encoded first data stream to the baseband data stream.

The encoding unit 44 encodes a second data stream different from the first data stream in the transmission data stream in a $2^M$-level mode (M represents an integer of 1 or more and less than N). Specifically, first, the encoding unit 44 encodes the second data stream using a second line encoding method different from the first line encoding method. Next, the encoding unit 44 converts the second data stream encoded using the second line encoding method into a high-resolution value that is modulated as one of amplitude levels corresponding to $2^M$ levels in the $2^N$-level pulse amplitude modulation for each set including M bits. The encoding unit 44 adds the second data stream converted into a series of the high-resolution values to the baseband data stream.

During reception, the receiver circuit 42 receives the transmission signal on which $2^N$-level pulse amplitude modulation has been performed per unit period. The receiver circuit 42 samples the transmission signal per unit period to generate the baseband data stream.

Here, the decoding unit 46 decodes the first data stream in the baseband data stream in a $2^N$-level mode. Specifically, the decoding unit 46 decodes the first data stream using the first line encoding method and adds the decoded first data stream to the transmission data stream.

The decoding unit 46 decodes the second data stream different from the first data stream in the baseband data stream in the $2^M$-level mode. Specifically, first, the decoding unit 46 converts the second data stream into a low-resolution value representing $2^M$ levels for each set including N bits. The decoding unit 46 decodes the second data stream converted into a series of the low-resolution values using the second line encoding method and adds the decoded second data stream to the transmission data stream.

Figure 6:
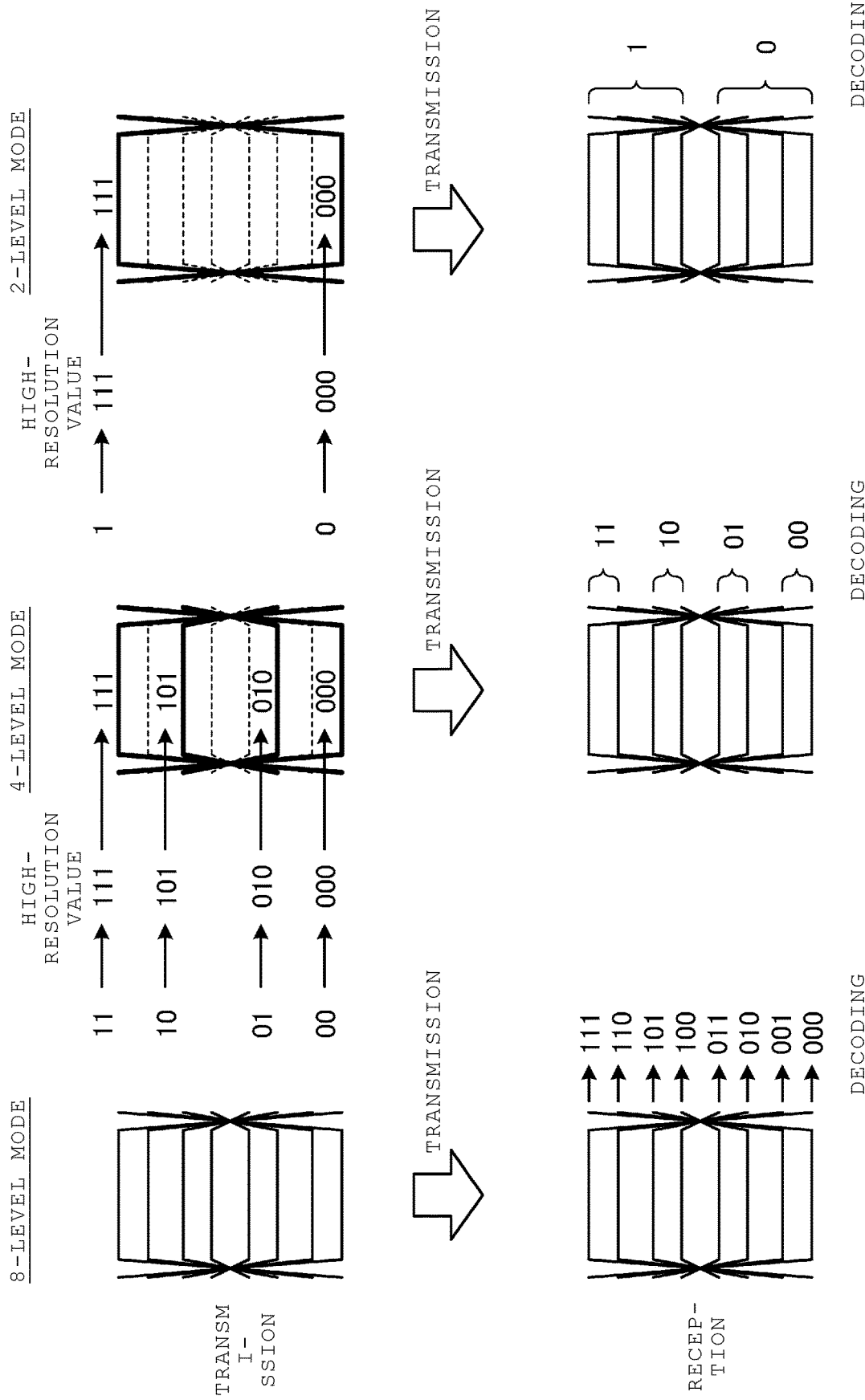
FIG. 6 is a diagram illustrating a waveform of a transmission signal on which 8-level pulse amplitude modulation has been performed.

For example, as illustrated in FIG. 6, the transmitter circuit 40 and the receiver circuit 42 may transmit and receive a transmission signal on which 8-level (=$2^3$-level) pulse amplitude modulation has been performed. FIG. 6 is a diagram illustrating a waveform of the transmission signal on which 8-level pulse amplitude modulation has been performed.

When the transmission signal on which 8-level (=$2^3$-level) pulse amplitude modulation has been performed is transmitted, the encoding unit 44 may encode the second data stream in the 4-level (=$2^2$-level) mode or the 2-level (=$2^1$-level) mode.

In the 4-level mode, the encoding unit 44 converts the second data stream into a high-resolution value that is modulated as one of amplitude levels corresponding to four levels among the eight levels for each set including two bits. For example, the encoding unit 44 converts 00 into 000, converts 01 into 010, converts 10 into 101, and converts 11 into 111. It is preferable that the amplitude levels corresponding to four levels among the eight levels include the maximum amplitude level and the minimum amplitude level.

In the 2-level mode, the encoding unit 44 converts each bit in the second data stream into a high-resolution value that is modulated as one of amplitude levels corresponding to two levels among the eight levels. For example, the encoding unit 44 converts 0 into 000 and converts 1 into 111. It is preferable that the amplitude levels corresponding to two levels among the eight levels include the maximum amplitude level and the minimum amplitude level.

When the transmission signal on which 8-level pulse amplitude modulation has been performed is received, the decoding unit 46 may decode the second data stream in the 4-level mode or the 2-level mode.

In the 4-level mode, the decoding unit 46 converts the second data stream into a low-resolution value representing four levels for each set including three bits. For example, when a set including three bits obtained by the sampling is 000 or 001, the decoding unit 46 converts 000 or 001 into 00. For example, when a set including three bits obtained by the sampling is 010 or 011, the decoding unit 46 converts 010 or 011 into 01. For example, when a set including three bits obtained by the sampling is 100 or 101, the decoding unit 46 converts 100 or 101 into 10. For example, when a set including three bits obtained by the sampling is 110 or 111, the decoding unit 46 converts 110 or 111 into 11.

In the 2-level mode, the decoding unit 46 converts the second data stream into a low-resolution value represented by two levels for each set including three bits. For example, when a value obtained by the sampling is 000, 001, 010, or 011, the decoding unit 46 converts 000, 001, 010, or 011 into 0. When a value obtained by the sampling is 100, 101, 110, or 111, the decoding unit 46 converts 100, 101, 110, or 111 into 1.

The information processing system 10 can modulate a data series including values less than $2^N$ into a part of the transmission signal on which $2^N$-level pulse amplitude modulation has been performed. As a result, the information processing system 10 according to the first embodiment can transmit and receive the transmission signal on which $2^N$-level pulse amplitude modulation having high affinity to the line encoding method used for the data series including values less than $2^N$ is performed.

Second Embodiment

Next, an information processing system 10 according to a second embodiment will be described. An overall configuration of the information processing system 10 according to the second embodiment is the same as the configuration illustrated in FIGS. 1 to 3. In the description of the second embodiment, components substantially the same functions and configurations as those of the first embodiment will be represented by the same reference numerals, and the detailed description other than differences will be omitted. The same is applied to third and subsequent embodiments.

In the second embodiment, 4-level pulse amplitude modulation is performed on the transmission signal. In the second embodiment, the first line encoding method is a 128b/132b encoding method. In the second embodiment, the second line encoding method is an 8b/10b encoding method. The same is applied to third and subsequent embodiments.

Figure 7:
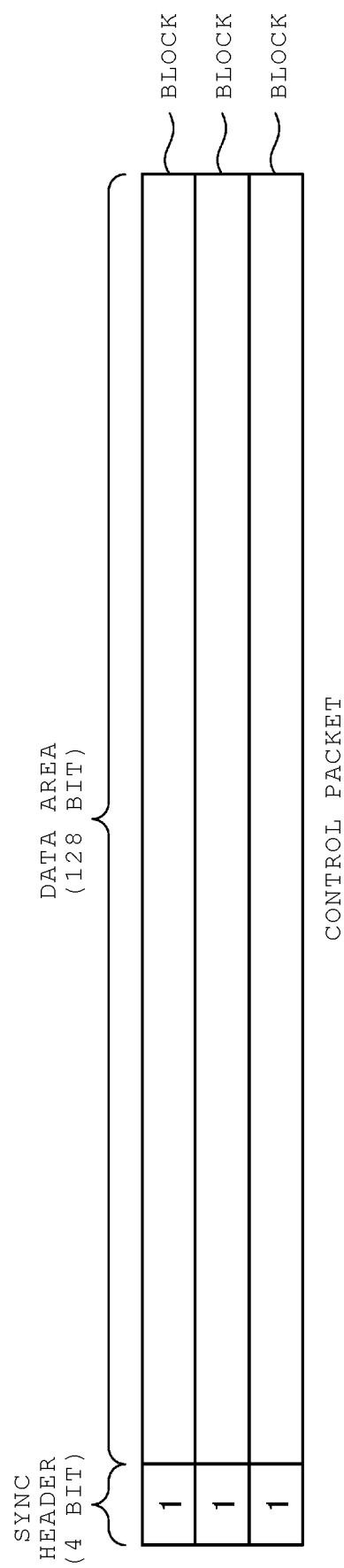
FIG. 7 is a diagram illustrating a basic configuration of a control packet in a 128b/132b encoding method.

FIG. 7 is a diagram illustrating a basic configuration of a control packet in the 128b/132b encoding method. The baseband data stream includes a plurality of continuous packets in a format determined by the 128b/132b encoding method.

Each of the plurality of packets includes one or a plurality of blocks having a data length determined by the 128b/132b encoding method. In each of the blocks, the data length is 132 bits.

Each of the blocks includes a sync header that is a synchronization code and a data area that follows the sync header. The sync header has a length of 4 bits. The data area has a length of 128 bits.

The sync header represents a head of a block. By detecting the sync header, the decoding unit 46 can detect the head of the block.

One type of the packets is a control packet including a predetermined control code for controlling transmission and reception. The control packet includes a control code in the data area of the blocks. The sync header of each of the blocks of the control packet is a predetermined value ("1" in FIG. 7) notifying the reception side that the data of the block to be transmitted is to be interpreted by two levels. The decoding unit 46 can identify a packet structure by referring to the value of the sync header and the content of the control code at a predetermined position (for example, the control code at a head of the data area) in the block at the head of the control packet. For example, the decoding unit 46 can identify the number of the blocks in the control packet, the position of the control code disposed in each of the blocks, and the like.

Figure 8:
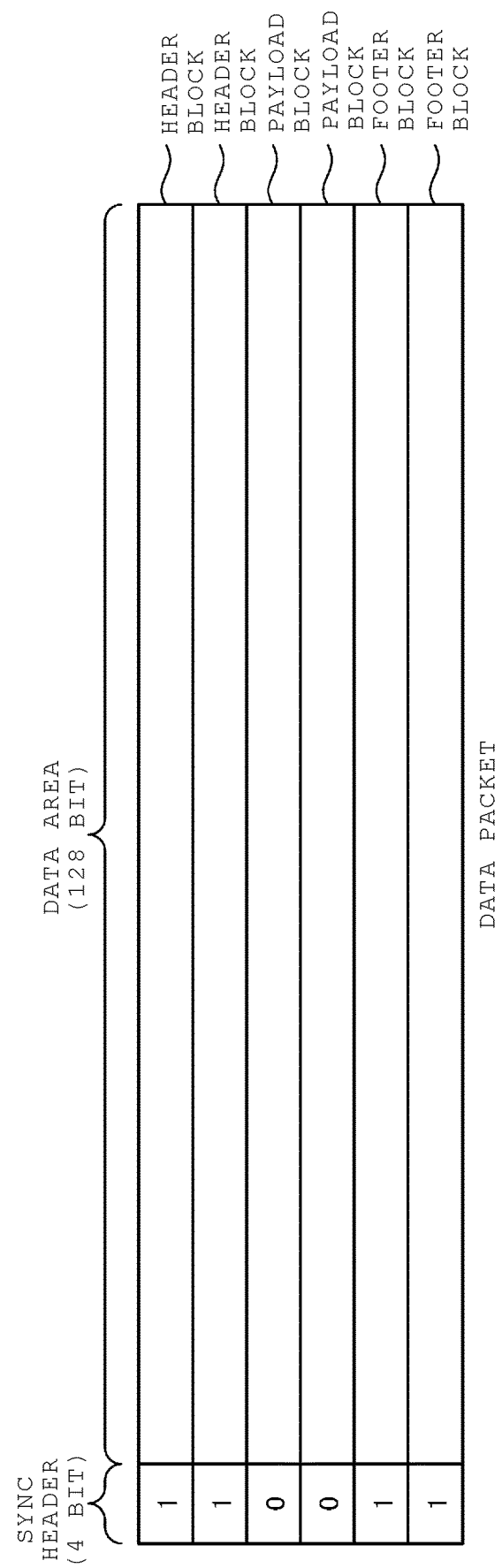
FIG. 8 is a diagram illustrating a basic configuration of a data packet in the 128b/132b encoding method.

FIG. 8 is a diagram illustrating a basic configuration of a data packet in the 128b/132b encoding method. One type of the packets is a data packet including payload data corresponds to substantial data. The data packet includes one or a plurality of header blocks, one or a plurality of footer blocks, and one or a plurality of payload blocks. In FIG. 8, both of the number of the header blocks and the number of the footer blocks are 2.

The one or the plurality of header blocks are disposed at the head of the data packet. Each of the one or the plurality of header blocks includes the control code in the data area.

The one or the plurality of footer blocks are disposed at the end of the data packet. Each of the one or the plurality of footer blocks includes the control code in the data area.

The one or the plurality of payload blocks are disposed between the one or the plurality of header blocks and the one or the plurality of footer blocks in the data packet. Each of the one or the plurality of payload blocks includes the payload data in the data area.

The sync header of each of the one or the plurality of header blocks is a predetermined value ("1" in FIG. 8) notifying the reception side that a signal of the block (the header block) to be transmitted is to be interpreted by two levels.

The sync header of each of the one or the plurality of footer blocks is a predetermined value ("1" in FIG. 8) notifying the reception side that a signal of the block (the footer block) to be transmitted is to be interpreted by two levels.

The decoding unit 46 can identify the packet structure by referring to the value of the sync header and the content of the control code at the predetermined position in the header block at the head. For example, the decoding unit 46 can identify the number of the blocks in the data packet, the position of the header block, the position of the footer block, the position of the control code disposed in the header block and the footer block, and the like.

Figure 9:
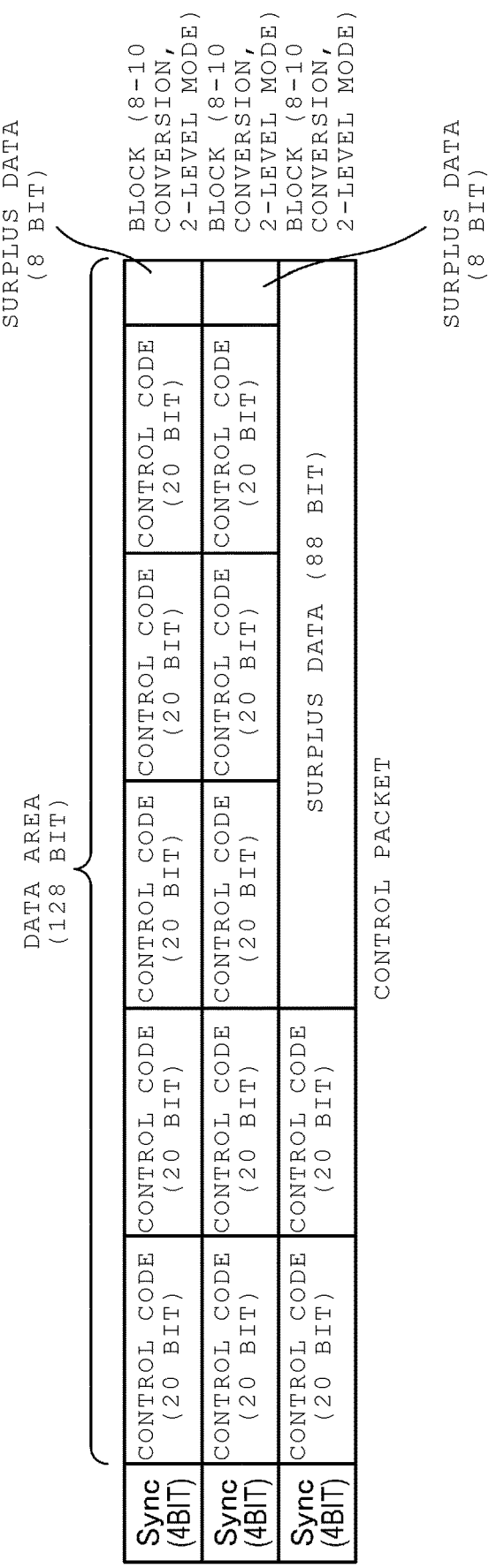
FIG. 9 is a diagram illustrating an example of a control packet according to a second embodiment.

FIG. 9 is a diagram illustrating an example of the control packet according to the second embodiment. When the control packet is generated, the encoding unit 44 acquires an 8-bit control code in the transmission data stream. When one control packet includes a plurality of control codes, the encoding unit 44 acquires the control codes one by one.

When the control packet is generated, the encoding unit 44 encodes the 8-bit control code using the 8b/10b encoding method for each of the control codes. As a result, the encoding unit 44 can generate a 10-bit control code encoded using the 8b/10b encoding method. Next, the encoding unit 44 converts each bit in the 10-bit control code encoded using the 8b/10b encoding method into a high-resolution value. For example, the encoding unit 44 converts 0 in the control code into 00 that corresponds to the minimum amplitude level in the 4-level mode, and converts 1 in the control code into 11 that corresponds to the maximum amplitude level in the 4-level mode. As a result, the encoding unit 44 can generate a 20-bit control code converted into a series of high-resolution values. The encoding unit 44 adds the 20-bit control code converted into the series of high-resolution values to a predetermined position in the control packet.

By executing such process, the encoding unit 44 can add the one or the plurality of control codes to the data area (128 bits) of each of the plurality of blocks in the control packet.

In the second embodiment, the encoding unit 44 adds the one or the plurality of control codes to the block such that the entire 20-bit control code is in one block. The data area of the block has a length of 128 bits, whereas the control code has a length of 20 bits. Accordingly, in the data area in the block, a surplus area that does not include the control code is generated. For example, a block including six control packets includes an 8-bit surplus area. For example, a block including two control packets includes an 88-bit surplus area.

Here, when the control packet is generated, the encoding unit 44 generates surplus data of bits corresponding to the surplus area in each of the blocks in the control packet. The encoding unit 44 adds the generated surplus data to the surplus area that does not include the control code in each of the blocks in the control packet.

The surplus data may be a data stream represented by a series of high-resolution values. For example, the surplus data may be a data stream that is a predetermined series of values represented by four levels. The surplus data may be data having a pattern where the direct current level is 0. The surplus data may be data fixed to a predetermined value. By generating the surplus data, the encoding unit 44 can generate a data stream corresponding to 128 bits in the data area for each of the blocks in the control packet.

When the control packet is acquired, the decoding unit 46 acquires the 20-bit control code from the data area of the block in the acquired control packet. When the control packet includes a plurality of control codes, the decoding unit 46 acquires all of the plurality of control codes one by one.

The decoding unit 46 converts the acquired 20-bit control code into a low-resolution value for each set including two bits. As a result, the decoding unit 46 can generate the 10-bit control code converted into a series of the low-resolution values.

Next, the decoding unit 46 decodes the 10-bit control code converted into the series of the low-resolution values using the 8b/10b encoding method. As a result, the decoding unit 46 can generate the 8-bit control code decoded using the 8b/10b encoding method. The decoding unit 46 adds the 8-bit control code decoded using the 8b/10b encoding method to the transmission data stream and outputs the transmission data stream. The decoding unit 46 discards the surplus data in the surplus area that does not include the control code in the control packet without decoding the surplus data.

Figure 10:
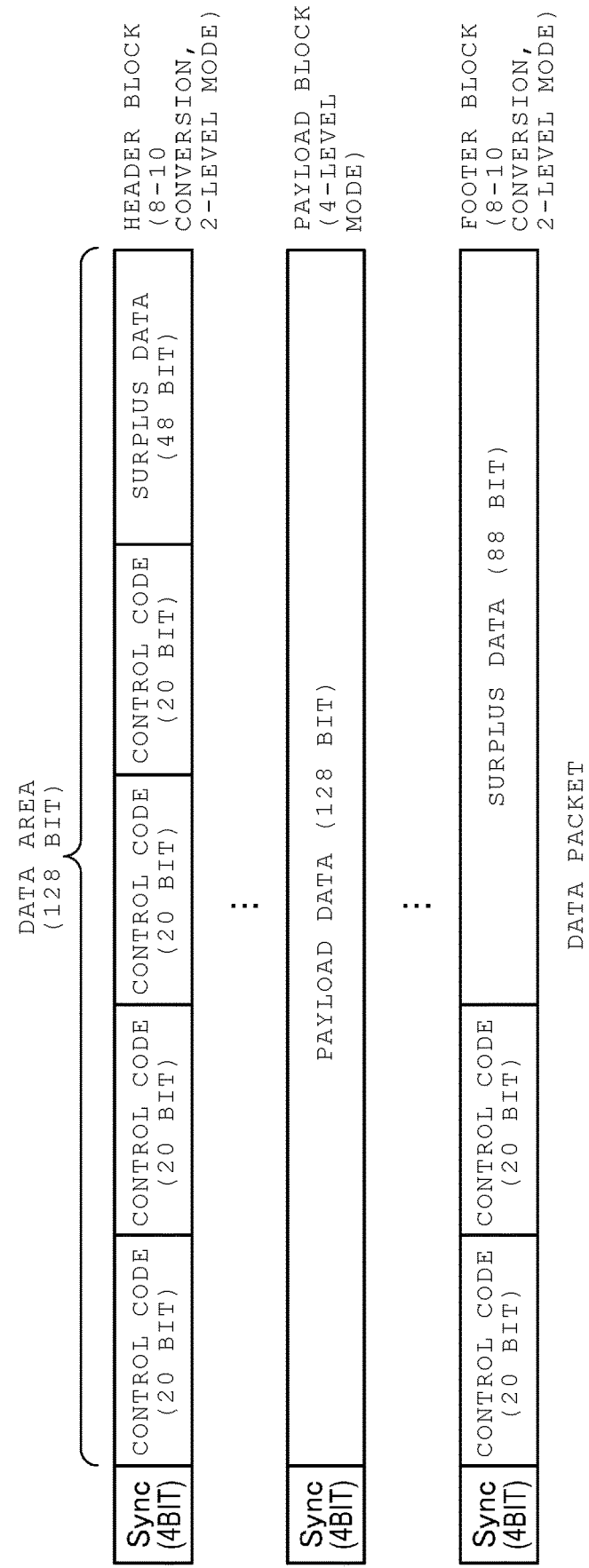
FIG. 10 is a diagram illustrating an example of a data packet according to the second embodiment.

FIG. 10 is a diagram illustrating an example of the data packet according to the second embodiment. When the data packet is generated, the encoding unit 44 acquires the 128-bit payload data in the transmission data stream. The encoding unit 44 adds the 128-bit payload data to the data area of the payload block without converting the 128-bit payload data. The encoding unit 44 may add the data stream in the transmission data stream to the data area of the payload block after encoding the data stream using any applicable method.

When the data packet is generated, the encoding unit 44 acquires the 8-bit control code in the transmission data stream. When one data packet includes a plurality of control codes, the encoding unit 44 acquires the control codes one by one.

When the data packet is generated, the encoding unit 44 encodes the 8-bit control code using the 8b/10b encoding method for each of the control codes. Next, the encoding unit 44 converts each value in the 10-bit control code encoded using the 8b/10b encoding method into a high-resolution value. The encoding unit 44 adds the 20-bit control code converted into a series of the high-resolution values to the one or the plurality of header blocks and the one or the plurality of footer blocks in the data packet.

The encoding unit 44 generates the surplus data of bits corresponding to the surplus area that does not include the control code in the one or the plurality of header blocks and the one or the plurality of footer blocks. The encoding unit 44 adds the generated surplus data to the surplus area in each of the one or the plurality of header blocks and the one or the plurality of footer blocks. As a result, the encoding unit 44 can generate a data stream corresponding to 128 bits in the data area for the header block or the footer block.

When the data packet is acquired, the decoding unit 46 acquires the 128-bit payload data from each of the data areas in the one of the plurality of payload blocks. The decoding unit 46 adds the payload data in each of the one or the plurality of payload blocks to the transmission data stream and outputs the transmission data stream. The decoding unit 46 may add the payload data in each of the one or the plurality of payload blocks to the data stream and output the data stream after decoding the payload data using any applicable method.

When the data packet is acquired, the decoding unit 46 acquires the 20-bit control code from each of the data area in the one or the plurality of header blocks and the one or the plurality of footer blocks. When the data packet includes a plurality of control codes, the decoding unit 46 acquires all of the plurality of control codes one by one.

The decoding unit 46 converts each of the acquired 20-bit control code into a low-resolution value for each set including two bits. Next, the decoding unit 46 decodes the 10-bit control code converted into a series of the low-resolution values using the 8b/10b encoding method. The decoding unit 46 adds the 8-bit control code decoded using the 8b/10b encoding method to the transmission data stream and outputs the transmission data stream. The decoding unit 46 discards the surplus data in the surplus area that does not include the control code in the one or the plurality of header blocks and the one or the plurality of footer blocks without decoding the surplus data.

Figure 11:
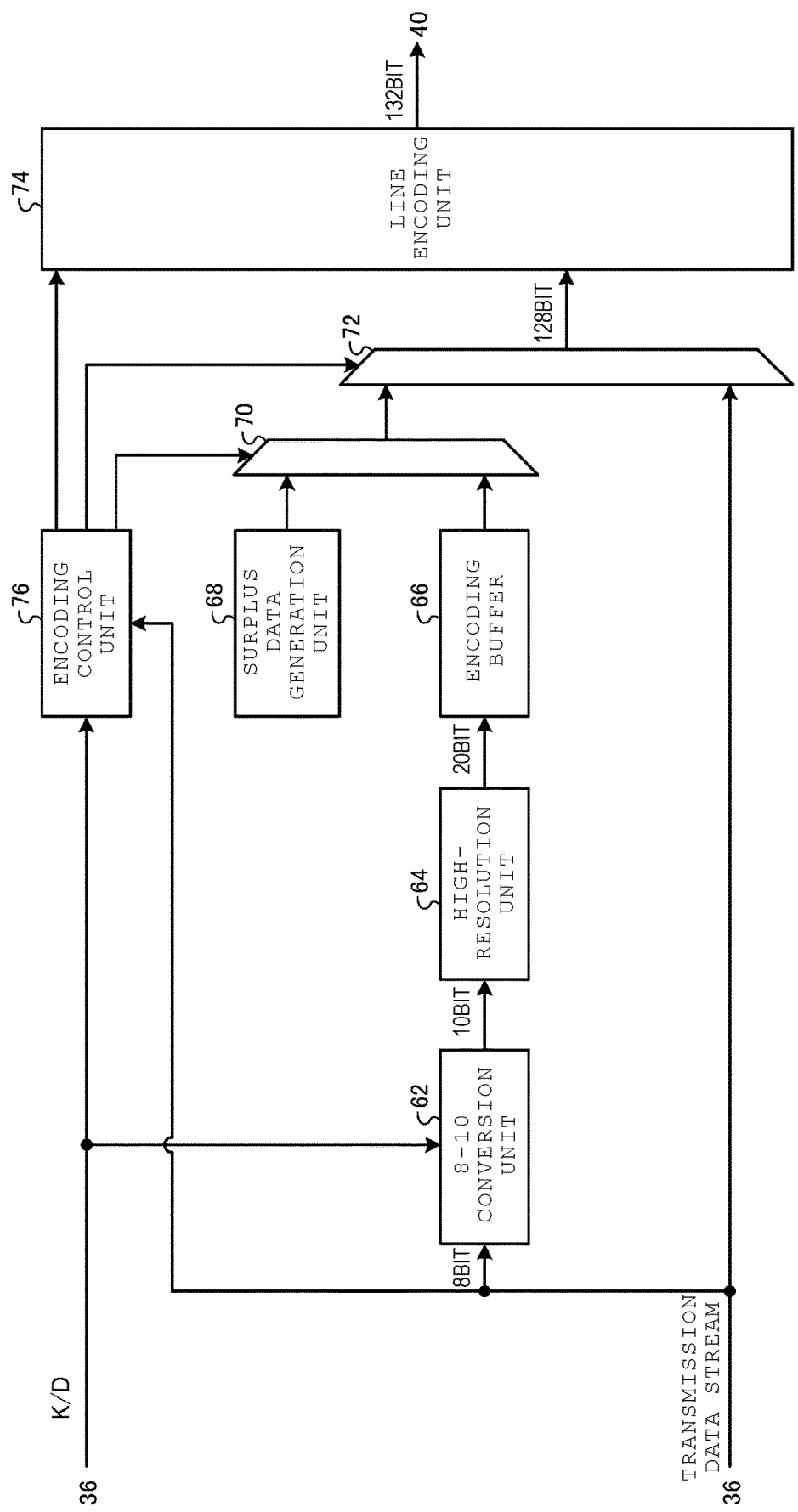
FIG. 11 is a diagram illustrating a configuration of an encoding unit according to the second embodiment.

FIG. 11 is a diagram illustrating the configuration of the encoding unit 44 according to the second embodiment. The encoding unit 44 receives the transmission data stream from the data link unit 36. The encoding unit 44 executes a process on the received transmission data stream for each cycle synchronized with the block.

The encoding unit 44 according to the second embodiment includes an 8-10 conversion unit 62, a high-resolution unit 64, an encoding buffer 66, a surplus data generation unit 68, a first multiplexer 70, a second multiplexer 72, a line encoding unit 74, and an encoding control unit 76.

The 8-10 conversion unit 62 receives the K/D signal and the transmission data stream from the data link unit 36. The 8-10 conversion unit 62 determines the position of the control code in the transmission data stream based on the K/D signal. When the transmission data stream includes the control code, the 8-10 conversion unit 62 acquires the control code from the transmission data stream. The control code in the transmission data stream has 8 bits. The 8-10 conversion unit 62 may acquire a plurality of control codes in one cycle.

The 8-10 conversion unit 62 encodes the acquired control code using the 8b/10b encoding method. As a result, the 8-10 conversion unit 62 can generate the 10-bit control code. When the 8-10 conversion unit 62 acquires a plurality of control codes in one cycle, the 8-10 conversion unit 62 encodes each of the plurality of control codes using the 8b/10b encoding method.

The high-resolution unit 64 receives the 10-bit control code encoded using the 8b/10b encoding method from the 8-10 conversion unit 62. The high-resolution unit 64 converts each value in the received 10-bit control code into a high-resolution value representing any one of the maximum value modulated as the maximum amplitude level or the minimum value modulated as the minimum amplitude level in the 4-level pulse amplitude modulation. As a result, the high-resolution unit 64 can generate the 20-bit control code converted into a series of high-resolution values. When the high-resolution unit 64 acquires a plurality of control codes in one cycle, the high-resolution unit 64 converts each of the plurality of control codes into the 20-bit control code converted into a series of the high-resolution values.

The encoding buffer 66 receives the 20-bit control code converted into the series of the high-resolution values from the high-resolution unit 64. The encoding buffer 66 outputs the received 20-bit control code converted into the series of the high-resolution values in order of reception. When the 20-bit control code converted into the series of the high-resolution values is to be added to the block in the next cycle, the encoding buffer 66 stores the received 20-bit control code until the next cycle.

The surplus data generation unit 68 generates the surplus data to be stored in the surplus area in a cycle of processing the block including the control code.

The first multiplexer 70 receives the 20-bit control code from the encoding buffer 66. The first multiplexer 70 receives the surplus data output from the surplus data generation unit 68. The first multiplexer 70 selects and outputs any one of the 20-bit control code or the surplus data in the cycle according to the control of the encoding control unit 76. As a result, the first multiplexer 70 can output a 128-bit data stream in a cycle of generating the block including the control code.

The second multiplexer 72 receives the transmission data stream corresponding to 128 bits from the data link unit 36. The second multiplexer 72 receives the 128-bit data stream from the first multiplexer 70. The second multiplexer 72 selects and outputs any one of the transmission data stream corresponding to 128 bits or the data stream output from the first multiplexer 70 for each cycle according to the control of the encoding control unit 76. When the payload block is generated, the second multiplexer 72 outputs the transmission data stream corresponding to 128 bits from the data link unit 36. When the block including the control code is generated, the second multiplexer 72 outputs the 128-bit data stream from the first multiplexer 70.

The line encoding unit 74 receives the 128-bit data stream output from the second multiplexer 72 in each cycle. The line encoding unit 74 adds the sync header that is a 4-bit synchronization code to the head of the 128-bit data stream and generates a 132-bit data stream. The line encoding unit 74 changes the value of the sync header according to the control of the encoding control unit 76. The line encoding unit 74 may execute a scramble process on data in the block other than the sync header using a predetermined method. The line encoding unit 74 outputs the generated 132-bit data stream as the baseband data stream corresponding to one block to the transmitter circuit 40 for each cycle.

The encoding control unit 76 receives the K/D signal and the transmission data stream from the data link unit 36. The encoding control unit 76 controls a switching timing of the first multiplexer 70 according to the K/D signal and the content of the transmission data stream.

The encoding control unit 76 controls a switching timing of the second multiplexer 72 according to the K/D signal and the content of the transmission data stream. The encoding control unit 76 controls the value of the sync header generated by the line encoding unit 74 according to the K/D signal and the content of the transmission data stream.

The encoding unit 44 having such configuration can encode and convert the transmission data stream received from the data link unit 36 into the baseband data stream using the 128b/132b encoding method. The encoding unit 44 can encode the control code in the transmission data stream using the 8b/10b encoding method. The encoding unit 44 can convert each value in the control code encoded using the 8b/10b encoding method into the high-resolution value representing any one of the maximum value modulated as the maximum amplitude or the minimum value modulated as the minimum amplitude in the 4-level pulse amplitude modulation. The encoding unit 44 can add the control code converted into a series of the high-resolution values to the baseband data stream encoded using the 128b/132b encoding method.

Figure 12:
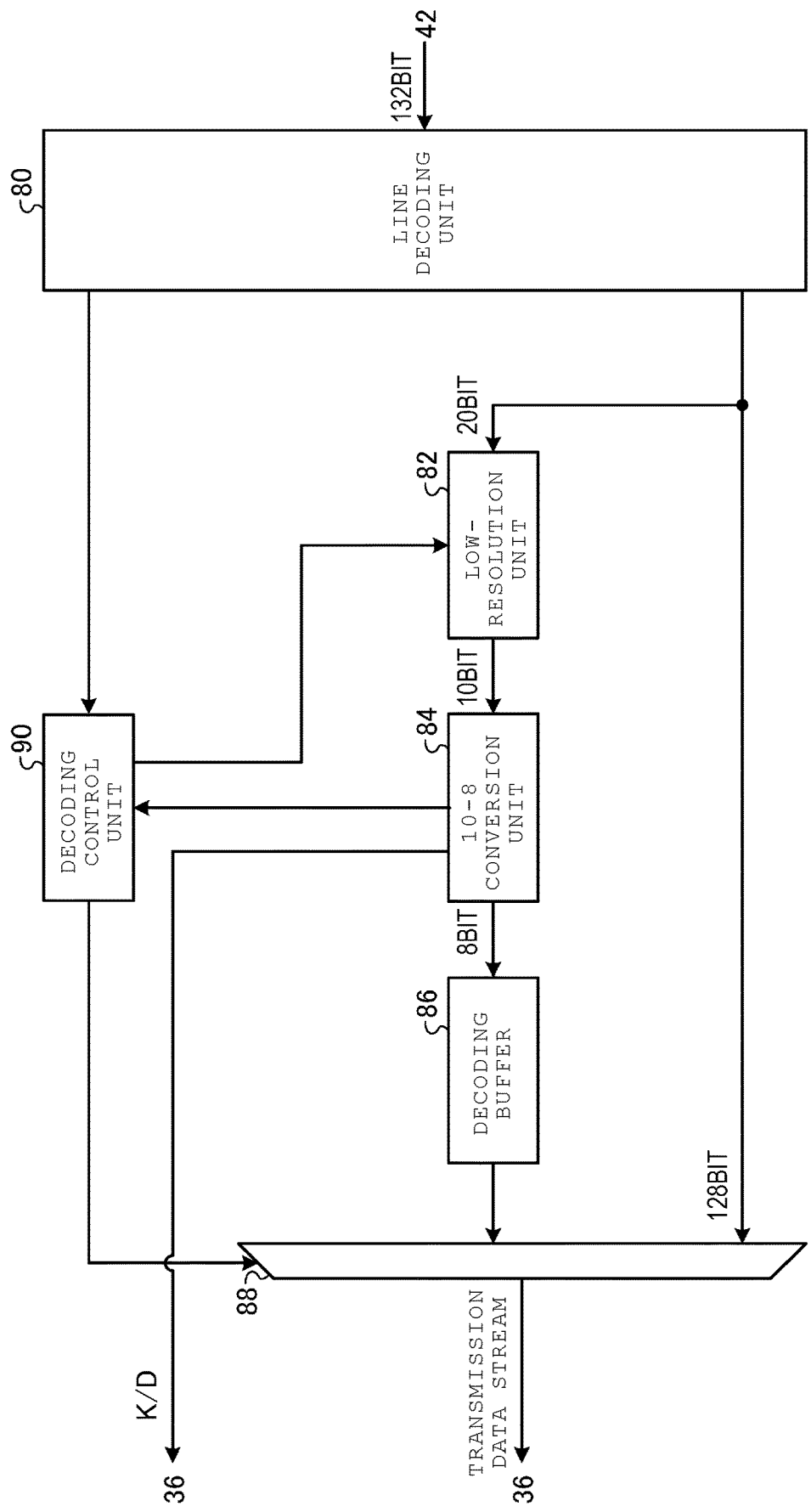
FIG. 12 is a diagram illustrating a configuration of a decoding unit according to the second embodiment.

FIG. 12 is a diagram illustrating the configuration of the decoding unit 46 according to the second embodiment. The decoding unit 46 acquires the 132-bit baseband data stream corresponding to one block from the receiver circuit 42 in each cycle. The decoding unit 46 executes the process on the received 132-bit baseband data stream for each cycle synchronized with the block.

The decoding unit 46 according to the second embodiment includes a line decoding unit 80, a low-resolution unit 82, a 10-8 conversion unit 84, a decoding buffer 86, a third multiplexer 88, and a decoding control unit 90.

The line decoding unit 80 receives the 132-bit baseband data stream corresponding to one block from the receiver circuit 42 in each cycle. The line decoding unit 80 provides the 4-bit sync header at the head of the 132-bit baseband data stream to the decoding control unit 90, and provides the remaining 128-bit data stream to the low-resolution unit 82 and the third multiplexer 88. The line decoding unit 80 may execute a descramble process on the 128-bit data stream other than the sync header using a predetermined method.

In a cycle of decoding the block including the control code, the low-resolution unit 82 acquires the one or the plurality of 20-bit control codes from the 128-bit baseband data stream according to the control of the decoding control unit 90. The low-resolution unit 82 discards the surplus data in the surplus area that does not include the control code in the 128-bit baseband data stream.

The low-resolution unit 82 converts each of the acquired 20-bit control codes into a low-resolution value for each set including two bits. As a result, the low-resolution unit 82 can generate the 10-bit control code.

The 10-8 conversion unit 84 acquires the 10-bit control code from the low-resolution unit 82. The 10-8 conversion unit 84 decodes the acquired 10-bit control code using the 8b/10b encoding method each time the 10-bit control code is acquired. As a result, the 10-8 conversion unit 84 can generate the 8-bit control code. The 10-8 conversion unit 84 generates the K/D signal representing whether the transmission data stream is the control code or the payload data. The 10-8 conversion unit 84 outputs the generated K/D signal to the data link unit 36.

The decoding buffer 86 outputs the 8-bit control code decoded using the 8b/10b encoding method in order of reception. When the received 8-bit control code is to be added to the transmission data stream in the next cycle, the decoding buffer 86 stores the received 8-bit control code until the next cycle.

When the line decoding unit 80 receives the payload block, the third multiplexer 88 receives the 128-bit payload data in the data area of the payload block received from the line decoding unit 80. When the line decoding unit 80 receives the block including the control code, the third multiplexer 88 receives the control code output from the decoding buffer 86. The third multiplexer 88 selects any one of the 128-bit payload data or the control code output from the decoding buffer 86 and outputs the selected data as the transmission data stream in each cycle according to the control of the decoding control unit 90.

The decoding control unit 90 receives the sync header from the line decoding unit 80. The decoding control unit 90 controls a position where the 20-bit control code is acquired by the low-resolution unit 82 according to the position of the sync header. The decoding control unit 90 controls whether the 128-bit payload data output from the line decoding unit 80 or the control code decoded by the 10-8 conversion unit 84 is output from the third multiplexer 88 according to the content of the sync header.

The decoding unit 46 having such configuration can add the payload data in the baseband data stream received from the receiver circuit 42 to the transmission data stream. The decoding unit 46 can convert the control code in the baseband data stream received from the receiver circuit 42 into a low-resolution value represented by two levels for each set including two bits. The decoding unit 46 can decode the control code converted into a series of the low-resolution values using the 8b/10b encoding method and add the decoded control code to the transmission data stream.

The information processing system 10 according to the second embodiment described above can demodulate the control code encoded using the 8b/10b encoding method from a part of the transmission signal on which the 4-level pulse amplitude modulation has been performed. As a result, the information processing system 10 according to the second embodiment can transmit and receive the transmission signal on which the 4-level pulse amplitude modulation having high affinity to the 8b/10b encoding method has been performed.

Figure 13:
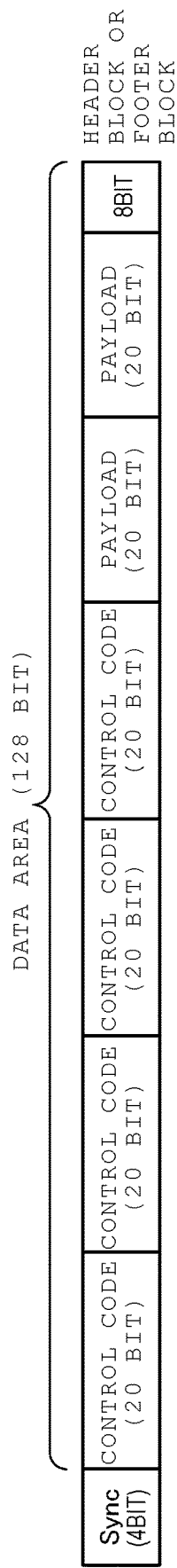
FIG. 13 is a diagram illustrating an example of a block according to a modification example of the second embodiment.

FIG. 13 is a diagram illustrating an example of the block according to a modification example of the second embodiment. When the data packet is generated, if the data length of the surplus area of the header block or the footer block is 20 bits or more, the encoding unit 44 may add the partial payload data that is a part of the payload data to the header block or the footer block.

If the data length of the surplus area of the header block or the footer block is 20 bits or more, the 8-10 conversion unit 62 acquires the 8-bit partial payload data that is a part of the payload data from the transmission data stream. The 8-10 conversion unit 62 may acquire a plurality of partial payload data.

The 8-10 conversion unit 62 encodes each of the acquired 8-bit partial payload data using the 8b/10b encoding method. As a result, the 8-10 conversion unit 62 can generate the 10-bit partial payload data.

The high-resolution unit 64 receives the 10-bit partial payload data encoded using the 8b/10b encoding method from the 8-10 conversion unit 62. The high-resolution unit 64 converts each value in the received 10-bit partial payload data into a high-resolution value. As a result, the high-resolution unit 64 can generate the 20-bit partial payload data. The encoding control unit 76 controls the first multiplexer 70 such that the 20-bit partial payload data converted into a series of the high-resolution values is added to the surplus area that does not include the control code in the header block or the footer block.

When the partial payload data is added to the surplus area of the header block or the footer block in the acquired data packet, the low-resolution unit 82 acquires not only the control code but also the 20-bit partial payload data in the surplus area. When a plurality of partial payload data are added to the surplus area, the low-resolution unit 82 acquires each of the plurality of partial payload data.

Each time the 20-bit partial payload data is acquired, the low-resolution unit 82 converts the acquired 20-bit partial payload data into low-resolution value for each set including two bits. As a result, the low-resolution unit 82 can generate the 10-bit partial payload data.

The 10-8 conversion unit 84 acquires the 10-bit partial payload data from the low-resolution unit 82. Each time the 10-bit partial payload data is acquired, the 10-8 conversion unit 84 decodes the acquired 10-bit partial payload data using the 8b/10b encoding method. As a result, the 10-8 conversion unit 84 can generate the 8-bit partial payload data.

The decoding buffer 86 outputs the 8-bit partial payload data decoded using 8b/10b encoding method together with the control code in order of reception and adds the 8-bit partial payload data to the transmission data stream. When the received 8-bit partial payload data is to be added to the transmission data stream in the next cycle, the decoding buffer 86 stores the received 8-bit partial payload data until the next cycle.

An information processing system 10 according to a modification example of the second embodiment can reduce the surplus area to improve the transmission efficiency of data.

Third Embodiment

Next, an information processing system 10 according to a third embodiment will be described.

Figure 14:
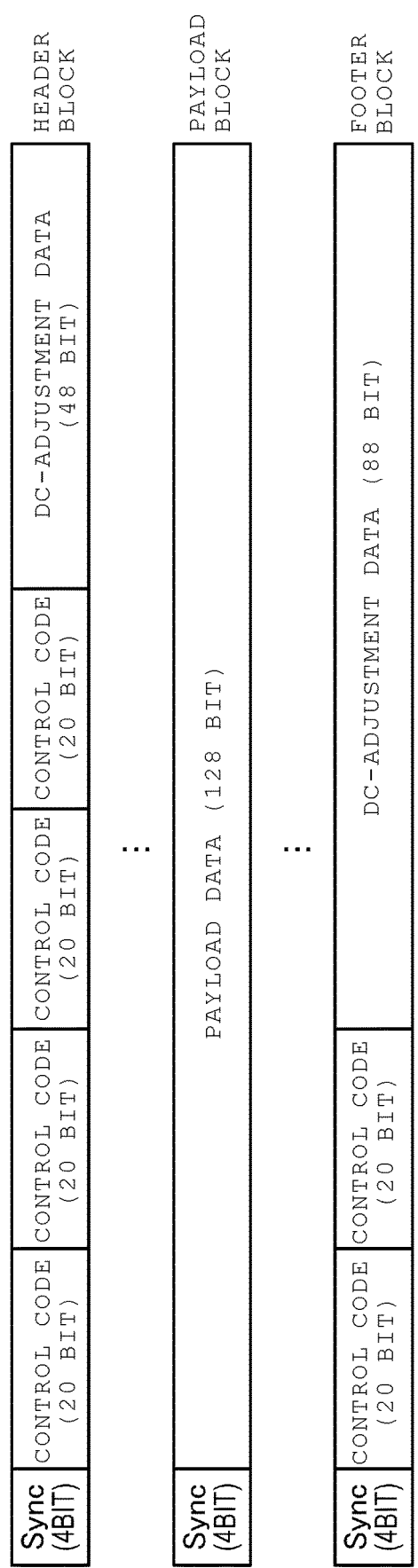
FIG. 14 is a diagram illustrating an example of a data packet according to a third embodiment.

FIG. 14 is a diagram illustrating an example of a data packet according to the third embodiment. An encoding unit 44a according to the third embodiment calculates a cumulative value obtained by cumulatively adding an amplitude in a transmission signal per unit period.

Regarding the amplitude of the transmission signal, for example, the intermediate value between the maximum amplitude level and the minimum amplitude level that can be achieved is represented as 0. For example, the amplitude level of the transmission signal in the unit period where 00 is modulated is −3. For example, the amplitude level of the transmission signal in the unit period where 01 is modulated is −1. For example, the amplitude level of the transmission signal in the unit period where 10 is modulated is +1. For example, the amplitude level of the transmission signal in the unit period where 11 is modulated is +3.

The data packet includes the payload block. There is a possibility that the payload data in the payload block is not data encoded such that the direct current component is 0. When the transmission signal where data having a direct current component other than 0 is modulated is received, there is a possibility that the receiver circuit 42 cannot accurately sample the transmission signal.

To address such issues, the encoding unit 44a according to the third embodiment adds a compensation data stream that is modulated in a direction in which the cumulative value approaches 0 to the surplus area that does not include the control code in each of the one or the plurality of header blocks and the one or the plurality of footer blocks in the data packet. The encoding unit 44a may add the compensation data stream that is modulated in the direction in which the cumulative value approaches 0 to the surplus area that does not include the control code in each of the plurality of blocks in the control packet. As a result, the encoding unit 44a can make the direct current component of the transmission signal approach 0. Accordingly, the receiver circuit 42 receives the transmission signal where the compensation data stream is modulated, and thus can more accurately sample the transmission signal.

Figure 15:
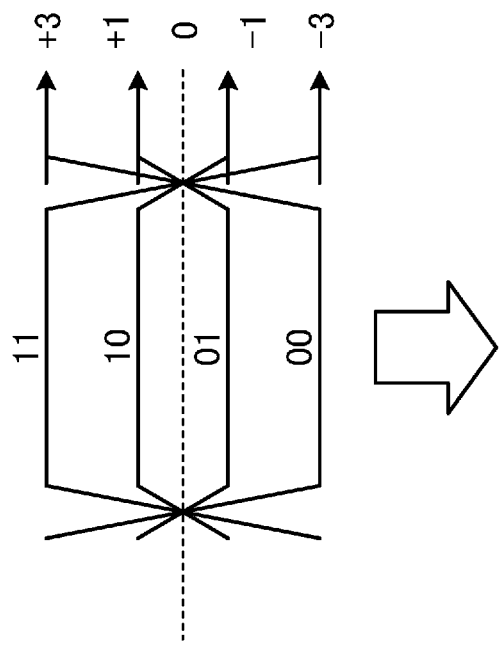
FIG. 15 is a diagram illustrating a change in cumulative value.

FIG. 15 is a diagram illustrating a change in the cumulative value. For example, in the cycle of the block including the control code, when the cumulative value in the previous block is 0 or more, the encoding unit 44a adds the compensation data stream where the amplitude value is negative to the surplus area. For example, in the cycle of the block including the control code, when the cumulative value in the previous block is less than 0, the encoding unit 44a adds the compensation data stream where the amplitude value is positive to the surplus area. As a result, the encoding unit 44a can make the cumulative value approach 0 such that the direct current component of the transmission signal approach 0.

For example, the encoding unit 44a adds the compensation data stream where the amplitude changes per unit period to the surplus area. For example, when the cumulative value is 0 or more, the encoding unit 44a adds the compensation data stream where the amplitude value alternately changes between −1 (01) and −3 (00) per unit period to the surplus area as illustrated in FIG. 15. For example, when the cumulative value is less than 0, the encoding unit 44a adds the compensation data stream where the amplitude value alternately changes between +1 (10) and +3 (11) per unit period to the surplus area. As a result, the encoding unit 44a can generate the transmission signal where the clock can be accurately recovered in the receiver circuit 42.

Figure 16:
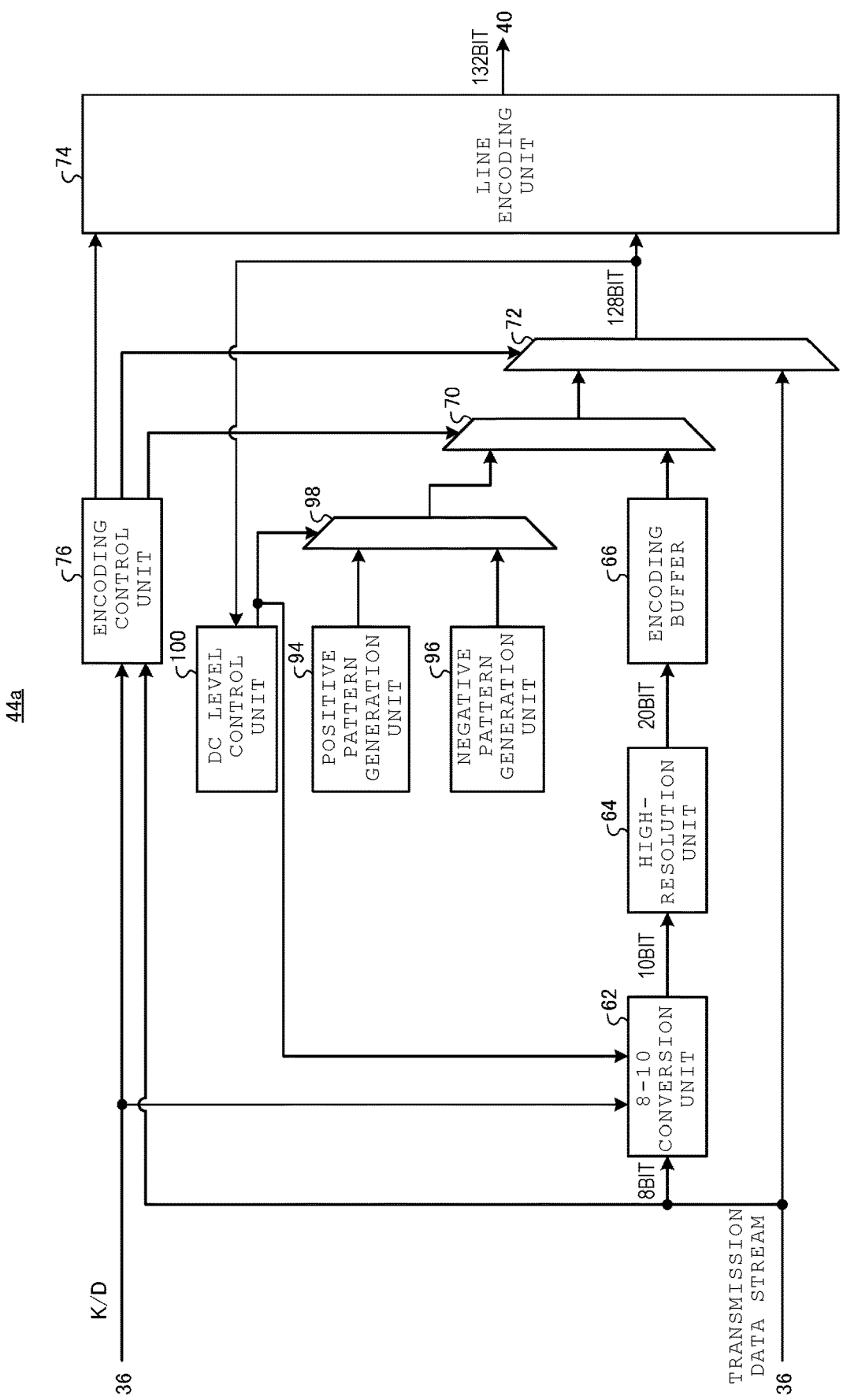
FIG. 16 is a diagram illustrating a configuration of an encoding unit according to the third embodiment.

FIG. 16 is a diagram illustrating the configuration of the encoding unit 44a according to the third embodiment. Instead of the surplus data generation unit 68 of the encoding unit 44 according to the second embodiment illustrated in FIG. 11, the encoding unit 44a according to the third embodiment includes a positive pattern generation unit 94, a negative pattern generation unit 96, a fourth multiplexer 98, and a DC level control unit 100.

The positive pattern generation unit 94 generates the compensation data stream where the cumulative value of the amplitudes of the transmission signal changes in a positive direction. The negative pattern generation unit 96 generates the compensation data stream where the cumulative value of the amplitudes of the transmission signal changes in a negative direction. The fourth multiplexer 98 selects one of the compensation data stream generated from the positive pattern generation unit 94 or the compensation data stream generated from the negative pattern generation unit 96 according to the control of the DC level control unit 100. The fourth multiplexer 98 outputs the selected compensation data stream to the first multiplexer 70.

The DC level control unit 100 calculates the cumulative value obtained by cumulatively adding the amplitude of the transmission signal per unit period based on the data stream output from the second multiplexer 72. When the cumulative value is 0 or more, the DC level control unit 100 causes the fourth multiplexer 98 to select the compensation data stream generated from the negative pattern generation unit 96. When the cumulative value is less than 0, the DC level control unit 100 causes the fourth multiplexer 98 to select the compensation data stream generated from the positive pattern generation unit 94. The DC level control unit 100 also provides the calculated cumulative value to the 8-10 conversion unit 62. The 8-10 conversion unit 62 encodes, for example, the control code in the footer block using the 8b/10b encoding method based on the previously provided cumulative value such that the cumulative value approaches 0.

The encoding unit 44a having such configuration can add the compensation data stream modulated in the direction in which the cumulative value approaches 0 to the surplus area. The decoding unit 46 according to the third embodiment has the same configuration as the decoding unit 46 according to the second embodiment illustrated in FIG. 12. In the decoding unit 46 according to the third embodiment, the low-resolution unit 82 discards the compensation data stream instead of discarding the surplus data.

The information processing system 10 according to the third embodiment can make the direct current component of the transmission signal approach 0 while maintaining the transmission efficiency. The information processing system 10 according to the third embodiment can accurately receive the transmission signal while maintaining the transmission efficiency.

Fourth Embodiment

Next, an information processing system 10 according to a fourth embodiment will be described.

FIG. 17 is a diagram illustrating an example of a data packet according to the fourth embodiment. An encoding unit 44b according to the fourth embodiment calculates a cumulative value obtained by cumulatively adding an amplitude level in a transmission signal per unit period. In the fourth embodiment, regarding the amplitude of the transmission signal, the intermediate value between the maximum amplitude level and the minimum amplitude level that can be achieved is represented as 0. For example, the encoding unit 44b calculates the cumulative value of the amplitude levels in the transmission signal using the same method as that of the third embodiment.

When the data packet is generated, in a first period after an absolute value of the cumulative value increases to be more than a predetermined first threshold and until the absolute value of the cumulative value decreases to be less than a predetermined second threshold that is equal to or less than the first threshold, the encoding unit 44b encodes the payload data to be stored in the payload block in the 2-level mode. That is, in the first period, the encoding unit 44b encodes the payload data to be stored in the payload block using the 8b/10b encoding method. For example, the encoding unit 44b acquires a predetermined number of partial payload data per 8 bits. The encoding unit 44b encodes each of the 8-bit partial payload data using the 8b/10b encoding method. As a result, the encoding unit 44b can generate the 10-bit partial payload data.

Next, in the first period, the encoding unit 44b converts each value in the payload data encoded using the 8b/10b encoding method into a high-resolution value. For example, the encoding unit 44b converts each value in the 10-bit partial payload data encoded using the 8b/10b encoding method into a high-resolution value. As a result, the encoding unit 44b can generate the 20-bit partial payload data that is a series of the high-resolution values.

In the first period, the encoding unit 44b adds the payload data converted into the series of the high-resolution values to the payload block. For example, the encoding unit 44b adds six pieces of 20-bit partial payload data converted into the series of the high-resolution values to the one payload block.

When the data packet is generated, in a second period different from the first period, that is, in a period after the absolute value of the cumulative value decreases to be less than the second threshold and until the absolute value of the cumulative value increases to be more than the first threshold, the encoding unit 44b encodes the payload data in the payload block in the 4-level mode. That is, in the second period, the encoding unit 44b encodes the payload data using the first line encoding method and adds the encoded payload data to the payload block. For example, in the second period, the encoding unit 44b adds the 128-bit payload data to the payload block without converting the 128-bit payload data.

There is a possibility that the payload data in the payload block is not data encoded such that the direct current component is 0. On the other hand, the data stream converted using the 8b/10b encoding method is encoded such that the direct current component is 0.

Accordingly, after the absolute value of the cumulative value of the amplitude levels of the transmission signal becomes more than the first threshold, the encoding unit 44b encodes the payload data in the 2-level mode such that the absolute value of the cumulative value of the amplitude levels of the transmission signal can be changed in the direction in which the absolute value of the cumulative value approaches 0. Accordingly, after the absolute value of the cumulative value of the amplitude levels of the transmission signal becomes less than the second threshold, the encoding unit 44b encodes the payload data in the 4-level mode such that the transmission efficiency can be improved.

The decoding unit 46 according to the fourth embodiment calculates a cumulative value obtained by cumulatively adding an amplitude level in the transmission signal per unit period.

When the data packet is acquired, in a third period after the absolute value of the cumulative value increases to be more than the first threshold and until the absolute value of the cumulative value decreases to be less than the second threshold, the decoding unit 46 decodes the payload data in the payload block in the 2-level mode. That is, in the third period, the decoding unit 46 acquires the partial payload data per 20 bits from the payload data in the payload block. The decoding unit 46 converts the acquired 20-bit partial payload data into a low-resolution value for each set including two bits. As a result, the decoding unit 46 can generate the 10-bit partial payload data converted into a series of the low-resolution values.

Next, in the third period, the decoding unit 46 decodes the 10-bit partial payload data converted into the series of the low-resolution values using the 8b/10b encoding method. As a result, the decoding unit 46 can generate the 8-bit partial payload data. In the third period, the decoding unit 46 adds the 8-bit partial payload data decoded using the 8b/10b encoding method to the transmission data stream. The decoding unit 46 discards the surplus data in the surplus area that does not include the partial payload data in the payload block without decoding the surplus data.

When the data packet is acquired, in a fourth period different from the third period, that is, in a period after the absolute value of the cumulative value decreases to be less than the second threshold and before the absolute value of the cumulative value increases to be more than the first threshold, the decoding unit 46 decodes the payload data in the payload block in the 4-level mode. That is, in the fourth period, the decoding unit 46 decodes the payload data using the first line encoding method and adds the decoded payload data to the transmission data stream. For example, in the fourth period, the decoding unit 46 adds the 128-bit payload data to the transmission data stream without converting the 128-bit payload data.

Figure 18:
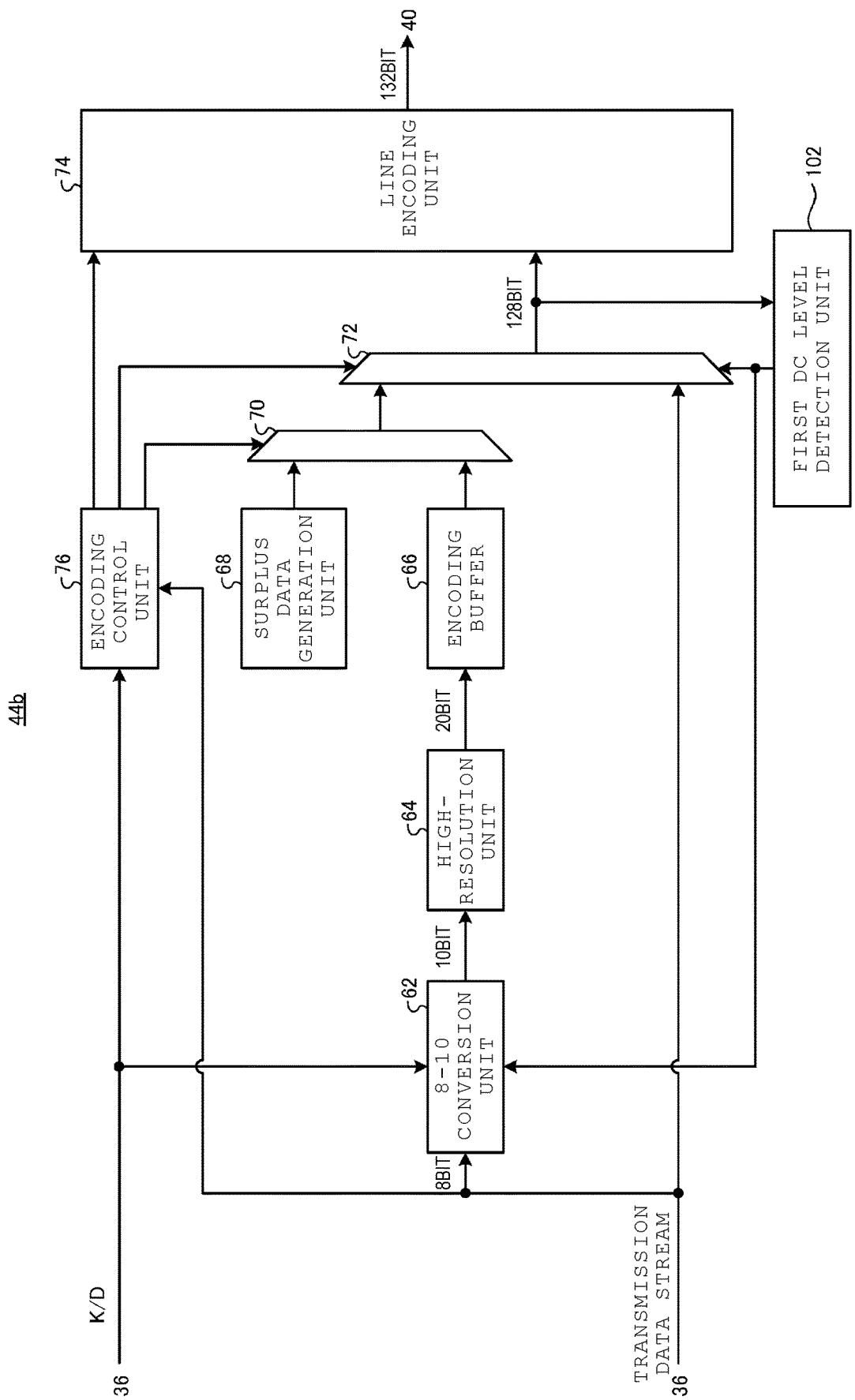
FIG. 18 is a diagram illustrating a configuration of an encoding unit according to the fourth embodiment.

FIG. 18 is a diagram illustrating the configuration of the encoding unit 44b according to the fourth embodiment. The encoding unit 44b according to the fourth embodiment includes not only the configuration of the encoding unit 44 according to the second embodiment illustrated in FIG. 11 but also a first DC level detection unit 102.

The 8-10 conversion unit 62, the high-resolution unit 64, and the encoding buffer 66 according to the fourth embodiment executes the process in the 2-level mode not only on the control code but also on the payload data.

That is, the 8-10 conversion unit 62 divides the payload data in the transmission data stream per 8 bits to acquire the 8-bit partial payload data. The 8-10 conversion unit 62 encodes the acquired 8-bit partial payload data using the 8b/10b encoding method. As a result, the 8-10 conversion unit 62 can generate the 10-bit partial payload data.

The high-resolution unit 64 receives the 10-bit partial payload data encoded using the 8b/10b encoding method from the 8-10 conversion unit 62. The high-resolution unit 64 converts each value in the received 10-bit partial payload data into a high-resolution value. As a result, the high-resolution unit 64 can generate the 20-bit partial payload data.

The encoding buffer 66 receives the 20-bit partial payload data converted into a series of the high-resolution values. The encoding buffer 66 outputs the received 20-bit partial payload data converted into the series of the high-resolution values in order of reception. When the 20-bit partial payload data converted into the series of the high-resolution values is to be added to the payload block in the next cycle, the encoding buffer 66 stores the received 20-bit partial payload data until the next cycle.

The first DC level detection unit 102 calculates an absolute value of the cumulative value obtained by cumulatively adding the amplitude level of the transmission signal per unit period based on the data stream output from the second multiplexer 72. When the data packet is generated, in the first period after the absolute value of the cumulative value increases to be more than the first threshold and until the absolute value of the cumulative value decreases to be less than the second threshold, the first DC level detection unit 102 causes the second multiplexer 72 to select the 20-bit partial payload data converted into the series of the high-resolution values. As a result, in the first period, the first DC level detection unit 102 can add the 20-bit partial payload data converted into the series of the high-resolution values to the payload block. The first DC level detection unit 102 also provides the calculated cumulative value to the 8-10 conversion unit 62. The 8-10 conversion unit 62 encodes, for example, the control code in the footer block using the 8b/10b encoding method based on the previously provided cumulative value such that the cumulative value approaches 0.

When the data packet is generated, in the second period, the first DC level detection unit 102 causes the second multiplexer 72 to select the 128-bit payload data that is acquired from the transmission data stream without being converted. As a result, in the second period, the first DC level detection unit 102 can add the payload data encoded using the 128b/132b encoding method to the payload block.

When the data packet is generated, in the first period after the absolute value of the cumulative value increases to be more than the predetermined first threshold and until the absolute value of the cumulative value decreases to be less than the predetermined second threshold, the encoding unit 44b having such configuration can encode the payload data to be stored in the payload block in the 2-level mode. When the data packet is generated, in the second period, the encoding unit 44b having such configuration can encode the payload data to be stored in the payload block in the 4-level mode.

Figure 19:
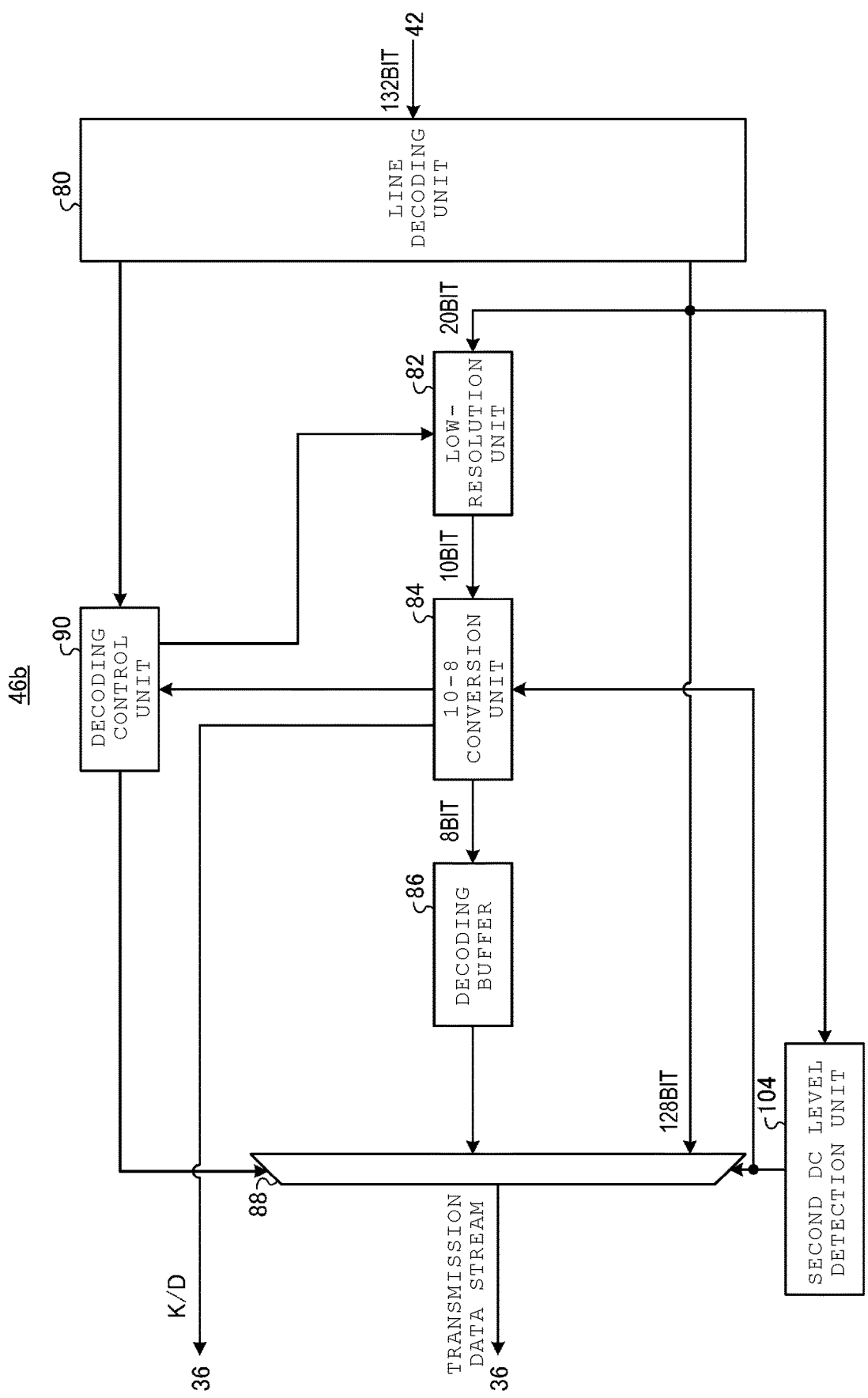
FIG. 19 is a diagram illustrating a configuration of a decoding unit according to the fourth embodiment.

FIG. 19 is a diagram illustrating a configuration of a decoding unit 46b according to the fourth embodiment. The decoding unit 46b according to the fourth embodiment includes not only the configuration of the decoding unit 46 according to the second embodiment illustrated in FIG. 12 but also a second DC level detection unit 104.

The low-resolution unit 82, the 10-8 conversion unit 84, and the decoding buffer 86 according to the fourth embodiment executes the process in the 2-level mode not only on the control code but also on the payload data.

In a cycle of decoding the payload block including the control code, the low-resolution unit 82 acquires the 128-bit baseband data stream for each 20-bit partial payload data according to the control of the decoding control unit 90. The low-resolution unit 82 discards the surplus data in the surplus area in the 128-bit baseband data stream.

The low-resolution unit 82 converts each of the 20-bit partial payload data into a low-resolution value for each set including two bits. As a result, the low-resolution unit 82 can generate the 10-bit partial payload data.

The 10-8 conversion unit 84 acquires the 10-bit partial payload data from the low-resolution unit 82. Each time the 10-bit partial payload data is acquired, the 10-8 conversion unit 84 decodes the acquired 10-bit partial payload data using the 8b/10b encoding method. As a result, the 10-8 conversion unit 84 can generate the 8-bit partial payload data.

The decoding buffer 86 outputs the 8-bit partial payload data decoded using 8b/10b encoding method in order of reception and adds the 8-bit partial payload data to the transmission data stream. When the received 8-bit partial payload data is to be added to the transmission data stream in the next cycle, the decoding buffer 86 stores the received 8-bit partial payload data until the next cycle.

The second DC level detection unit 104 calculates an absolute value of the cumulative value obtained by cumulatively adding the amplitude level of the transmission signal per unit period based on the data stream output from the line decoding unit 80. When the data packet is acquired, in the third period after the absolute value of the cumulative value increases to be more than the first threshold and until the absolute value of the cumulative value decreases to be less than the second threshold, the second DC level detection unit 104 causes the third multiplexer 88 to select the 8-bit partial payload data. As a result, in the third period, the second DC level detection unit 104 can add the 8-bit partial payload data to the transmission data stream.

When the data packet is acquired, in the fourth period different from the third period, the second DC level detection unit 104 causes the third multiplexer 88 to select the 128-bit payload data that is output from the line decoding unit 80 without being converted. As a result, in the fourth period, the second DC level detection unit 104 can add the payload data decoded using the 128b/132b encoding method to the transmission data stream. The second DC level detection unit 104 also provides the calculated cumulative value to the 10-8 conversion unit 84. The 10-8 conversion unit 84 decodes, for example, the control code in the footer block using the 8b/10b encoding method based on the previously provided cumulative value such that the cumulative value approaches 0.

When the data packet is acquired, in the third period after the absolute value of the cumulative value increases to be more than the first threshold and until the absolute value of the cumulative value decreases to be less than the second threshold, the decoding unit 46 having such configuration can decode the payload data in the 2-level mode. When the data packet is acquired, in the fourth period, the decoding unit 46 having such configuration can decode the payload data in the 4-level mode.

The information processing system 10 according to the fourth embodiment can make the direct current component of the transmission signal approach 0 while maintaining the transmission efficiency. The information processing system 10 according to the fourth embodiment can accurately receive the transmission signal while maintaining the transmission efficiency.

Fifth Embodiment

Next, an information processing system 10 according to a fifth embodiment will be described.

Figure 20:
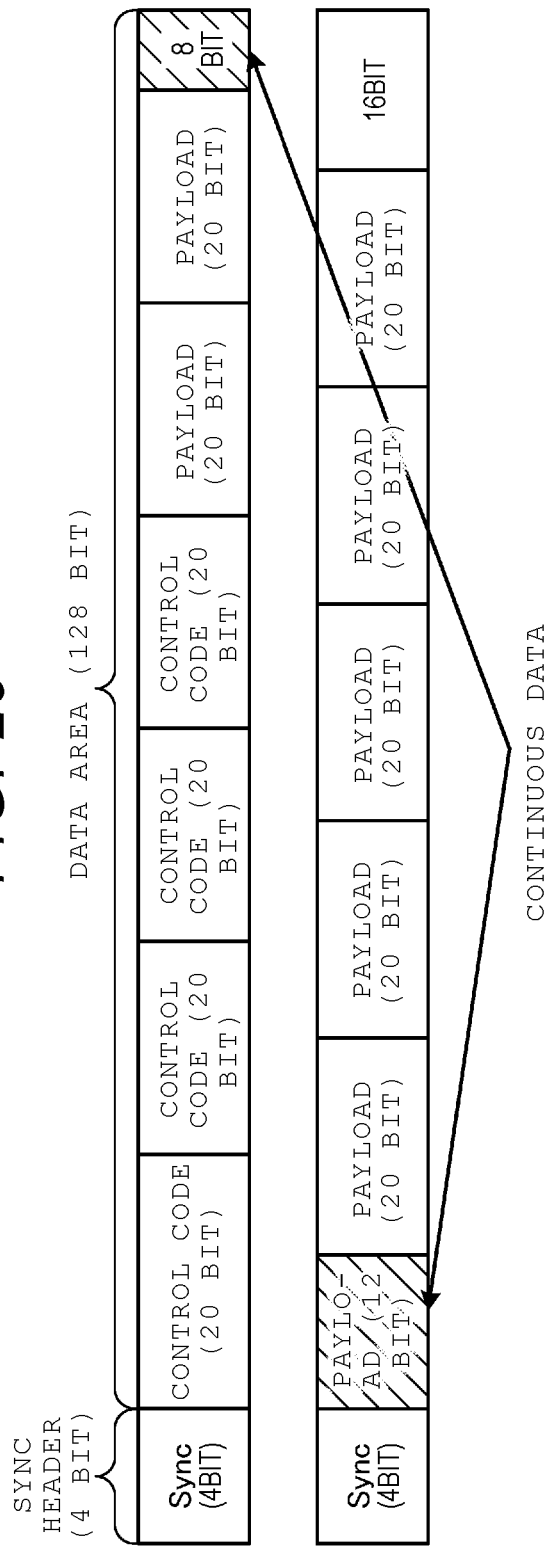
FIG. 20 is a diagram illustrating a block according to a fifth embodiment.

FIG. 20 is a diagram illustrating a block according to a fifth embodiment. The encoding unit 44 encodes a second data stream (the control code or the partial payload data) that is a part of the transmission data stream in the 2-level mode to generate the 20-bit second data stream converted into a series of the high-resolution values. On the other hand, the data area of the 128b/132b encoding method has 128 bits. Accordingly, when the encoding unit 44 arranges a plurality of the second data streams having a length of 20 bits in the data area in one block, a surplus area (for example, 8 bits) that does not include the second data stream is generated in the data area.

Accordingly, in the fifth embodiment, the encoding unit 44 divides the 20-bit second data stream (the control code or the partial payload data) disposed at the end of the data area of the block into two continuous blocks and adds the divided blocks to the data area. For example, when the surplus area is generated in a first block, the encoding unit 44 divides the 20-bit second data stream disposed at the end of the first block into a first half of partial data stream having a data length corresponding to the surplus area and a second half of remaining partial data stream. The encoding unit 44 arranges the first half of partial data stream at the end of the data area of the first block. The encoding unit 44 temporarily stores the second half of partial data stream into the buffer and arranges the second half of partial data stream at the head of the data area of a second block that follows the first block in the next cycle.

In the fifth embodiment, when the second data stream is divided into two continuous blocks and added to the data area, the decoding unit 46 acquires the second data stream from a data stream obtained by synthesizing the two baseband data streams in the two continuous blocks. For example, when the first block and the second block are continuous, the decoding unit 46 synthesizes a part of the end in the baseband data stream of the first block and a part of the head in the baseband data stream of the second block to acquire the second data stream.

For example, the decoding unit 46 temporarily stores the first half of partial data stream acquired from the end of the data area of the first block into the buffer without decoding the first half of partial data stream. In the next cycle, the decoding unit 46 synthesizes the first half of partial data stream that is temporarily stored in the buffer and the second half of partial data stream that is acquired from the head of the data area of the second block. As a result, the decoding unit 46 can acquire the second data stream from the data stream obtained by synthesizing the two baseband data streams in the two continuous blocks.

Figure 21:
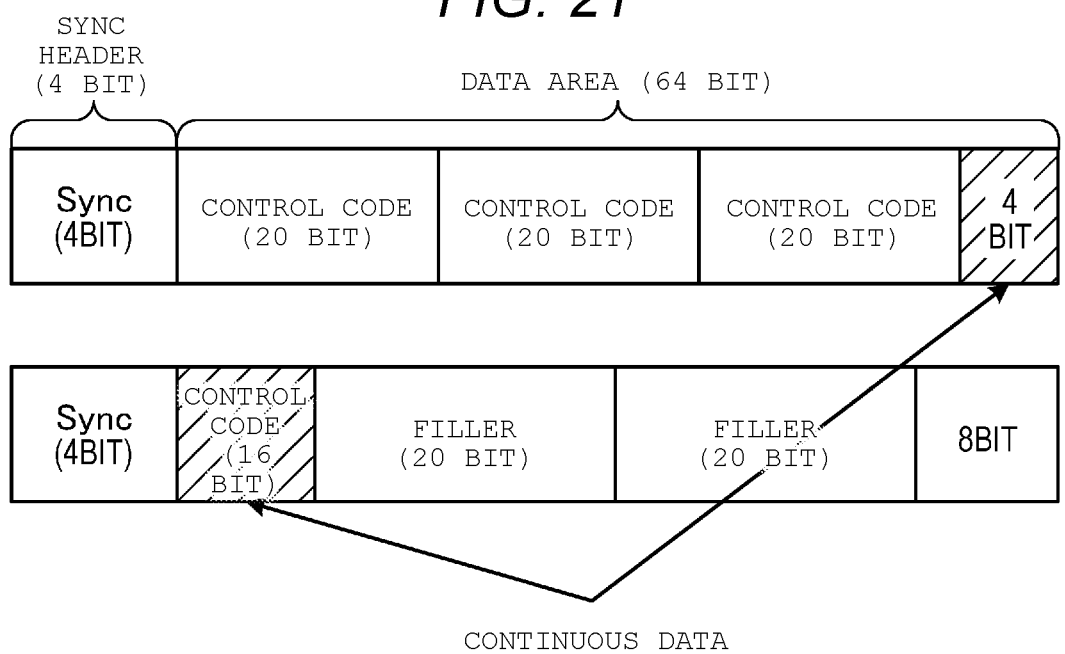
FIG. 21 is a diagram illustrating another example of the block according to the fifth embodiment.

FIG. 21 is a diagram illustrating another example of the block according to the fifth embodiment. The first line encoding method may be a 64b/68b encoding method instead of the 128b/132b encoding method. The data area of the 64b/68b encoding method has 64 bits. Therefore, when a data stream having a length of 20 bits is disposed, a surplus area is generated as in the 128b/132b encoding method. Accordingly, even when the 64b/68b encoding method is used as the first line encoding method, the encoding unit 44 may divide the second data stream (for example, the control code or the payload data) converted into a series of the high-resolution values into two continuous blocks and add to the data area.

The information processing system 10 according to the fifth embodiment can reduce the surplus area to improve the transmission efficiency of data.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A transmission device comprising:
    an encoding circuit configured to:
        encode a first data stream portion of a transmission data stream in accordance with a first encoding protocol and a second data stream portion of the transmission data stream in accordance with a second encoding protocol;
        convert each M bit of the encoded second data stream portion into a high-resolution value of N bit, M being an integer equal to or greater than 1 and N being an integer greater than M; and
        generate a baseband data stream including the encoded first data stream portion and the converted second data stream portion; and
    a modulation circuit configured to perform a $2^N$-level pulse amplitude modulation with respect to each N bit of the encoded first data stream portion in the baseband data stream and each N bit of the converted second data stream portion in the baseband data stream, to generate a transmission signal.

2. The transmission device according to claim 1, wherein M is 1 and N is 2, and
the high-resolution value of N bit is a value corresponding to the maximum or minimum level of the $2^N$-level pulse amplitude.

3. The transmission device according to claim 2, wherein the second line encoding method is an 8b/10b encoding method, and
the second data stream portion includes control codes for controlling transmission and reception.

4. The transmission device according to claim 2, wherein the baseband data stream includes one or a plurality of blocks having a fixed data length determined by the first line encoding method,
each of the blocks includes a sync header that is a synchronization code and a data area that follows the sync header,
the sync header is used to represent whether the corresponding data area is from the encoded first data stream portion or the converted second data stream portion.

5. The transmission device according to claim 4, wherein the second line encoding method is an 8b/10b encoding method,
the second data stream portion includes one or a plurality of control packets including one or a plurality of control codes for controlling transmission and reception.

6. The transmission device according to claim 4, wherein the second line encoding method is an 8b/10b encoding method,
the second data stream portion includes header and footer of data packets,
the first data stream portion includes payload data of data packets,
the encoding circuit is configured to encode and convert the header of data packets into one or a plurality of header blocks,
the encoding circuit is configured to encode the payload data of data packets into one or a plurality of payload blocks, and
the encoding circuit is configured to encode and convert the footer of data packets into one or a plurality of footer blocks.

7. The transmission device according to claim 6, wherein the encoding circuit is configured to fill in the surplus area in the header blocks with data generated by encoding and converting the first potion of the following payload data in the same way as the second data stream portion.

8. The transmission device according to claim 6, wherein the encoding circuit is configured to calculate a cumulative value obtained by cumulatively adding $2^N$-level amplitude levels of data streams modulated by the modulation circuit, and
the encoding circuit is configured to fill in the surplus area with a compensation data stream that is to be modulated into the value with opposite sign of the cumulative value.

9. The transmission device according to claim 6, wherein the encoding circuit is configured to calculate a cumulative value obtained by cumulatively adding $2^N$-level amplitude levels of data streams modulated by the modulation circuit, and
the encoding circuit is configured to treat all of the transmission data stream as the second data stream portion after the absolute value of the cumulative value exceeds a predetermined first threshold until the absolute value of the cumulative value falls below a predetermined second threshold that is equal to or less than the first threshold.

10. The transmission device according to claim 4, wherein the encoding unit is configured to divide the second data stream converted into a series of the high-resolution values into two continuous blocks.

11. A reception device comprising:
a sampling circuit configured to sample a transmission signal generated with $2^N$-level pulse amplitude modulation, N being an integer equal to or greater than two, during each predetermined period, to generate a baseband data stream, which includes a first data stream portion and a second data stream portion; and
a decoding circuit configured to:
decode the first data stream portion in accordance with a first decoding protocol;
convert each N bit of the second data stream portion into a low-resolution value of M bit, M being an integer equal to or greater than 1 and less than N;
decode the converted second data stream portion in accordance with a second decoding protocol; and
generate a transmission data stream including the decoded first data stream portion and the converted second data stream portion.

12. The reception device according to claim 11, wherein M is 1 and N is 2.

13. The reception device according to claim 12, wherein the second line decoding method is an 8b/10b decoding method, and
the second data stream portion includes control codes for controlling transmission and reception.

14. The reception device according to claim 12, wherein the baseband data stream includes one or a plurality of blocks having a fixed data length determined by the first line encoding method,
each of the blocks includes a sync header that is a synchronization code and a data area that follows the sync header,
the sync header is used to detect whether the corresponding data area is the first data stream portion or the second data stream portion.

15. The reception device according to claim 14, wherein the second line decoding method is an 8b/10b decoding method,
the second data stream portion includes control packets including a control code for controlling transmission and reception.

16. The reception device according to claim 14, wherein the second line decoding method is an 8b/10b decoding method,
the second data stream portion includes header and footer of data packets,
the first data stream portion includes payload data of data packets,
the decoding circuit is configured to convert and decode the header block of data packets into header of the packet,
the decoding circuit is configured to decode the payload block of data packets into payload data of the packet, and
the decoding circuit is configured to convert and decode the footer block of data packets into footer of the packet.

17. The reception device according to claim 16, wherein
the decoding circuit is configured to acquire not only header but also partial payload data from one or a plurality of partial payload units having a predetermined size which follow the header in the header blocks in the second data stream portion.

18. The reception device according to claim 16, wherein the decoding circuit is configured to calculate a cumulative value obtained by cumulatively adding $2^N$-level amplitude levels of data streams, and
the decoding circuit is configured to treat all of the baseband data stream as the second data stream portion after the absolute value of the cumulative value exceeds a predetermined first threshold until the absolute value of the cumulative value falls below a predetermined second threshold that is equal to or less than the first threshold.

19. The reception device according to claim 16, wherein the decoding unit is configured to discard a surplus data in the blocks.

20. The reception device according to claim 14, wherein the decoding unit is configured to acquire the second data stream portion from a data stream obtained by synthesizing the two baseband data streams in two continuous blocks with each other.

\* \* \* \* \*